United States Patent
Yamazaki

(10) Patent No.: US 10,446,668 B2
(45) Date of Patent: Oct. 15, 2019

(54) SEMICONDUCTOR DEVICE AND METHOD FOR FABRICATING THE SAME

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 75 days.

(21) Appl. No.: 14/934,417

(22) Filed: Nov. 6, 2015

(65) Prior Publication Data

US 2016/0064525 A1 Mar. 3, 2016

Related U.S. Application Data

(62) Division of application No. 13/959,900, filed on Aug. 6, 2013, now Pat. No. 9,184,245.

(30) Foreign Application Priority Data

Aug. 10, 2012 (JP) ................................ 2012-178641

(51) Int. Cl.
*H01L 29/66* (2006.01)
*H01L 29/267* (2006.01)
(Continued)

(52) U.S. Cl.
CPC .. *H01L 29/66742* (2013.01); *H01L 21/31051* (2013.01); *H01L 21/324* (2013.01);
(Continued)

(58) Field of Classification Search
CPC ........... H01L 29/66742; H01L 29/4908; H01L 29/1054; H01L 21/324; H01L 21/31051;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 102194887 A 9/2011
EP 1737044 A 12/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Mohammed R Alam
(74) *Attorney, Agent, or Firm* — Fish & Richardson P.C.

(57) ABSTRACT

To provide a highly reliable semiconductor device exhibiting stable electrical characteristics. To fabricate a highly reliable semiconductor device. Included are an oxide semiconductor stack in which a first to a third oxide semiconductor layers are stacked, a source and a drain electrode layers contacting the oxide semiconductor stack, a gate electrode layer overlapping with the oxide semiconductor layer with a gate insulating layer provided therebetween, and a first and a second oxide insulating layers between which the oxide semiconductor stack is sandwiched. The first to the third oxide semiconductor layers each contain indium, gallium, and zinc. The proportion of indium in the second oxide semiconductor layer is higher than that in each of the first and the third oxide semiconductor layers. The first and the third oxide semiconductor layers are each an amorphous semiconductor film. The second oxide semiconductor layer is a crystalline semiconductor film.

19 Claims, 14 Drawing Sheets

(51) Int. Cl.
  *H01L 27/108*   (2006.01)
  *H01L 27/1156*  (2017.01)
  *H01L 27/118*   (2006.01)
  *H01L 27/12*    (2006.01)
  *H01L 21/3105*  (2006.01)
  *H01L 21/324*   (2006.01)
  *H01L 29/10*    (2006.01)
  *H01L 29/49*    (2006.01)

(52) U.S. Cl.
  CPC .... *H01L 27/10873* (2013.01); *H01L 27/1156* (2013.01); *H01L 27/11807* (2013.01); *H01L 27/1225* (2013.01); *H01L 29/1054* (2013.01); *H01L 29/267* (2013.01); *H01L 29/4908* (2013.01)

(58) Field of Classification Search
  CPC ............. H01L 27/1225; H01L 27/1156; H01L 27/11807; H01L 27/10873; H01L 29/267
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,077 B2 | 9/2012 | Akimoto et al. |
| 8,274,078 B2 | 9/2012 | Itagaki et al. |
| 8,466,463 B2 | 6/2013 | Akimoto et al. |
| 8,502,221 B2 | 8/2013 | Yamazaki |
| 8,669,556 B2 | 3/2014 | Yamazaki et al. |
| 8,680,522 B2 | 3/2014 | Yamazaki et al. |
| 8,709,864 B2 | 4/2014 | Yamazaki et al. |
| 8,767,442 B2 | 7/2014 | Matsuzaki et al. |
| 8,883,556 B2 | 11/2014 | Yamazaki |
| 8,994,021 B2 | 3/2015 | Yamazaki et al. |
| 9,130,049 B2 | 9/2015 | Sano et al. |
| 9,318,613 B2 | 4/2016 | Yamazaki |
| 9,331,208 B2 | 5/2016 | Yamazaki et al. |
| 9,443,984 B2 | 9/2016 | Yamazaki |
| 9,537,043 B2 | 1/2017 | Yamazaki et al. |
| 9,583,637 B2 | 2/2017 | Sano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0081826 A1 | 3/2009 | Cowdery-Corvan et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0206332 A1 | 8/2009 | Son et al. |
| 2009/0239335 A1 | 9/2009 | Akimoto et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0038641 A1 | 2/2010 | Imai |

(56) References Cited

U.S. PATENT DOCUMENTS

| | | | |
|---|---|---|---|
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0320458 A1 | 12/2010 | Umeda et al. | |
| 2010/0320459 A1 | 12/2010 | Umeda et al. | |
| 2011/0089417 A1 | 4/2011 | Yamazaki et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0133191 A1* | 6/2011 | Yamazaki | H01L 27/1225 257/57 |
| 2011/0140100 A1 | 6/2011 | Takata et al. | |
| 2011/0156026 A1 | 6/2011 | Yamazaki et al. | |
| 2011/0163311 A1 | 7/2011 | Akimoto et al. | |
| 2011/0193083 A1 | 8/2011 | Kim et al. | |
| 2011/0215328 A1 | 9/2011 | Morosawa et al. | |
| 2011/0240990 A1 | 10/2011 | Yamazaki | |
| 2011/0240991 A1 | 10/2011 | Yamazaki | |
| 2011/0284848 A1 | 11/2011 | Yamazaki | |
| 2011/0298027 A1 | 12/2011 | Isobe et al. | |
| 2012/0032163 A1 | 2/2012 | Yamazaki | |
| 2012/0043541 A1 | 2/2012 | Godo et al. | |
| 2012/0051117 A1* | 3/2012 | Yamazaki | G11C 14/0054 365/149 |
| 2012/0112257 A1 | 5/2012 | Kato | |
| 2012/0119205 A1 | 5/2012 | Taniguchi et al. | |
| 2012/0129288 A1 | 5/2012 | Kobayashi et al. | |
| 2012/0132903 A1* | 5/2012 | Yamazaki | H01L 21/0242 257/43 |
| 2012/0161132 A1 | 6/2012 | Yamazaki | |
| 2012/0181534 A1 | 7/2012 | Hatano | |
| 2012/0187395 A1* | 7/2012 | Koezuka | H01L 29/7869 257/43 |
| 2012/0193625 A1* | 8/2012 | Sasagawa | H01L 29/41733 257/57 |
| 2012/0305913 A1 | 12/2012 | Yamazaki et al. | |
| 2012/0319183 A1* | 12/2012 | Yamazaki | H01L 29/7782 257/288 |
| 2012/0327032 A1* | 12/2012 | Jeon | H01L 27/14609 345/175 |
| 2013/0320330 A1 | 12/2013 | Yamazaki | |
| 2013/0320334 A1 | 12/2013 | Yamazaki et al. | |
| 2013/0334533 A1 | 12/2013 | Yamazaki | |
| 2014/0001465 A1 | 1/2014 | Yamazaki | |
| 2014/0008647 A1 | 1/2014 | Yamazaki | |
| 2014/0014947 A1 | 1/2014 | Yamazaki | |
| 2014/0027762 A1 | 1/2014 | Tsurume et al. | |
| 2014/0034945 A1 | 2/2014 | Tokunaga et al. | |
| 2014/0034946 A1 | 2/2014 | Yamazakis et al. | |
| 2014/0042433 A1 | 2/2014 | Yamazaki | |
| 2014/0042434 A1 | 2/2014 | Yamazaki | |
| 2014/0042435 A1 | 2/2014 | Yamazaki | |
| 2014/0042437 A1 | 2/2014 | Yamazaki | |
| 2014/0042438 A1 | 2/2014 | Yamazaki | |
| 2014/0264521 A1 | 9/2014 | Matsuzaki et al. | |
| 2015/0053977 A1 | 2/2015 | Yamazaki | |
| 2016/0225908 A1 | 8/2016 | Yamazaki | |
| 2016/0240694 A1 | 8/2016 | Yamazaki et al. | |
| 2016/0380107 A1 | 12/2016 | Yamazaki | |
| 2017/0125605 A1 | 5/2017 | Sano et al. | |

FOREIGN PATENT DOCUMENTS

| | | |
|---|---|---|
| EP | 2226847 A | 9/2010 |
| EP | 2428959 A | 3/2012 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-165529 A | 6/2006 |
| JP | 2007-096055 A | 4/2007 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2011-119720 A | 6/2011 |
| JP | 2011-187506 A | 9/2011 |
| JP | 2011-228695 A | 11/2011 |
| JP | 2011-243745 | * 12/2011 |
| JP | 2011-243745 A | 12/2011 |
| JP | 2011-243969 A | 12/2011 |
| JP | 2012-009843 A | 1/2012 |
| JP | 2012-015500 A | 1/2012 |
| JP | 2012-054547 A | 3/2012 |
| JP | 2012-084851 A | 4/2012 |
| JP | 2012-134467 A | 7/2012 |
| JP | 2012-134475 A | 7/2012 |
| JP | 2012-151460 A | 8/2012 |
| JP | 2012-151461 A | 8/2012 |
| JP | 2012-160679 A | 8/2012 |
| KR | 2011-0100580 A | 9/2011 |
| TW | 200915579 | 4/2009 |
| WO | WO-2004/114391 | 12/2004 |
| WO | WO-2006/051993 | 5/2006 |
| WO | WO-2008/133345 | 11/2008 |
| WO | WO-2009/034953 | 3/2009 |
| WO | WO-2011/055769 | 5/2011 |
| WO | WO-2011/122364 | 10/2011 |
| WO | WO-2012/073844 | 6/2012 |
| WO | WO-2012/073918 | 6/2012 |
| WO | WO-2012/090973 | 7/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(56) References Cited

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, the Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 13, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in The In2O3 and Sc2O3—A2O3—Bo Systems [A; Fe, Ga, or Al; B: Mg, Mn, Fe, Ni, Cu,Or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMo3(ZnO)m (M=in,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID DIGEST '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B. (Physical Review. B), 2008, vol. 77, pp. 245262-1-245202-6.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 IN. QVGA AMOLED Display Using In—Ga—Zn—Oxide TFTS With a Novel Passivation Layer", SID DIGEST '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, the Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

Nakayama et al., "17a-TL-8 Effect of GaO Layer on IGZO-TFT Channel", Extended Abstracts (The 57th Spring Meeting 2010), the Japan Society of Applied Physics and Related Societies, Mar. 17, 2010, pp. 21-008.

* cited by examiner

SEMICONDUCTOR DEVICE AND METHOD FOR FABRICATING THE SAME

CROSS-REFERENCE TO RELATED APPLICATIONS

This application is a divisional of U.S. application Ser. No. 13/959,900, filed Aug. 6, 2013, now allowed, which claims the benefit of foreign a priority application filed in Japan as Serial No. 2012-178641 on Aug. 10, 2012, both of which are incorporated by reference.

BACKGROUND OF THE INVENTION

1. Field of the Invention

The present invention relates to a semiconductor device and a method for fabricating the capitalized semiconductor device.

Note that a semiconductor device in this specification refers to all devices which can function by utilizing semiconductor characteristics, and electro-optical devices, semiconductor circuits, and electronic devices are all semiconductor devices.

2. Description of the Related Art

Attention has been focused on a technique for forming a transistor including a semiconductor thin film formed over a substrate having an insulating surface (also referred to as a thin film transistor). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an oxide semiconductor containing indium (In), gallium (Ga), and zinc (Zn) is disclosed in Patent Document 1.

An oxide semiconductor film can be formed by a technique for forming a thin film, such as a sputtering method. Further, the oxide semiconductor film can be formed at a relatively low temperature compared to a silicon semiconductor or the like. Hence, the oxide semiconductor film can be formed to overlap with another transistor. For example, Patent Document 2 discloses a semiconductor device in which a cell area is reduced by providing, over a transistor including silicon, a transistor including an oxide semiconductor layer serving as a channel formation region.

REFERENCE

[Patent Document 1] Japanese Published Patent Application No. 2006-165528
[Patent Document 2] Japanese Published Patent Application No. 2012-15500

SUMMARY OF THE INVENTION

In a transistor including an oxide semiconductor layer serving as a channel formation region, an oxygen vacancy (an oxygen defect) is generated by release of oxygen from the oxide semiconductor layer, and a carrier is generated due to the oxygen vacancy. Further, entry of an impurity such as hydrogen into the oxide semiconductor layer causes generation of a carrier.

The carrier generated in the oxide semiconductor layer increases the off-state current of the transistor and a variation in threshold voltage. Thus, a shift in electrical characteristics of the transistor occurs, leading to a reduction in reliability of a semiconductor device.

In view of the foregoing problem, an object of one embodiment of the present invention is to provide a highly reliable semiconductor device exhibiting stable electrical characteristics. Another object of one embodiment of the present invention is to fabricate a highly reliable semiconductor device.

A semiconductor device of one embodiment of the present invention includes an oxide semiconductor stack in which a first oxide semiconductor layer, a second oxide semiconductor layer, and a third oxide semiconductor layer are stacked, and a first oxide insulating layer and a second oxide insulating layer between which the oxide semiconductor stack is provided. In the semiconductor device, the first to the third oxide semiconductor layers each contain at least indium, the proportion of indium in the second oxide semiconductor layer is higher than that in each of the first oxide semiconductor layer and the third oxide semiconductor layer, the first oxide semiconductor layer and the third oxide semiconductor layer are amorphous, and the second oxide semiconductor layer has a crystalline structure.

Since the proportion of indium in the second oxide semiconductor layer is higher than that in each of the first oxide semiconductor layer and the third oxide semiconductor layer, the second oxide semiconductor layer has high carrier mobility and serves as a carrier path. Hence, a carrier flows in a region apart from the oxide insulating layers provided under and over the oxide semiconductor stack. Thus, an effect of impurities or the like entering from the oxide insulating layers can be reduced.

Materials of the oxide semiconductor stack are selected as appropriate so that a well-shaped structure (also referred to as a well structure) is formed in which the bottom of the conduction band of the second oxide semiconductor layer is at the deepest energy level. Specifically, materials may be selected as appropriate so that the bottom of the conduction band of the second oxide semiconductor layer is deeper from the vacuum level than the bottoms of the conduction bands of the first and the third oxide semiconductor layers.

Further, if silicon or carbon which is one of Group 14 elements is contained as an impurity in the oxide semiconductor layer, it can work as a donor and form an n-type region. Thus, the concentration of silicon contained in the oxide semiconductor layer is made lower than or equal to $3 \times 10^{18}$ atoms/cm$^3$, preferably lower than or equal to $3 \times 10^{17}$ atoms/cm$^3$. Further, the concentration of carbon in the oxide semiconductor layer is made lower than or equal to $3 \times 10^{18}$ atoms/cm$^3$, preferably lower than or equal to $3 \times 10^{17}$ atoms/cm$^3$. It is particularly preferable to employ a structure where the first and the third oxide semiconductor layers sandwich or surround the second oxide semiconductor layer serving as a carrier path so that a large number of Group 14 elements do not enter the second oxide semiconductor layer. That is to say, the first and the third oxide semiconductor layer can also be called barrier layers which prevent Group 14 elements such as silicon from entering the second oxide semiconductor layer.

If hydrogen or moisture is contained as an impurity in the oxide semiconductor stack, it can work as a donor and form an n-type region. Therefore, in terms of achieving the well-shaped structure, it is useful to provide a protective film (e.g., a silicon nitride film) that prevents entry of hydrogen or moisture from outside, over or under the oxide semiconductor layer.

With the oxide semiconductor layers having the above stacked-layer structure, a region where a channel is formed can have an absorption coefficient due to the localized states measured by a constant photocurrent method (CPM) which is lower than or equal to $3\times10^{-3}$/cm (lower than or equal to $3\times10^{\square\square}$/cm$^3$ when converted into density of states).

A semiconductor device of one embodiment of the present invention includes a first oxide insulating layer formed over a semiconductor substrate, an oxide semiconductor stack in which a first oxide semiconductor layer, a second oxide semiconductor layer, and a third oxide semiconductor layer are stacked over the first oxide insulating layer, a second oxide insulating layer over the oxide semiconductor stack, and a first gate electrode layer overlapping with the oxide semiconductor stack with the second oxide insulating layer provided therebetween. In the semiconductor device, the first to the third oxide semiconductor layers each contain at least indium, the proportion of indium in the second oxide semiconductor layer is higher than the proportion of indium in each of the first oxide semiconductor layer and the third oxide semiconductor layer, the second oxide semiconductor layer has a crystalline structure, and the first oxide semiconductor layer and the third oxide semiconductor layer are amorphous.

In addition to the above-described structure, a first nitride insulating layer may be provided under the first oxide insulating layer, and a second nitride insulating layer may be provided over the second oxide insulating layer. The first and the second nitride insulating layers prevent entry of hydrogen, moisture, or the like into the oxide semiconductor stack.

The first oxide insulating layer and the second oxide insulating layer may each contain oxygen in excess of the stoichiometric composition. When oxygen is thus contained in excess of the stoichiometric composition, oxygen can be supplied to the oxide semiconductor stack, so that an oxygen vacancy can be filled with oxygen.

In the first oxide semiconductor layer and the third oxide semiconductor layer, at least the concentration of indium may be higher than or equal to $1\times10^{19}$ atoms/cm$^3$. Further, in the oxide semiconductor stack, the absorption coefficient due to localized states may be lower than or equal to $3\times10^{-3}$/cm.

For example, the first oxide semiconductor layer, the second oxide semiconductor layer, and the third oxide semiconductor layer are each found using oxide including indium, zinc, and gallium. When the first oxide semiconductor layer, the second oxide semiconductor layer, and the third oxide semiconductor layer are each formed using the same elements, scatterings at the interface between the first and the second oxide semiconductor layers and the interface between the second and the third oxide semiconductor layers can be reduced.

The semiconductor device may include a second gate electrode layer overlapping with the oxide semiconductor stack with the first oxide insulating layer provided therebetween.

The second oxide semiconductor layer may have a crystal whose c-axis is aligned in a direction approximately perpendicular to a surface.

The concentration of silicon in each of the first oxide semiconductor layer and the third oxide semiconductor layer may be lower than or equal to $3\times10^{18}$ atoms/cm$^3$. The concentration of carbon in each of the first oxide semiconductor layer and the third oxide semiconductor layer may be lower than or equal to $3\times10^{18}$ atoms/cm$^3$.

Another embodiment of the present invention is a method for fabricating a semiconductor device, including the following steps: forming a first oxide insulating layer over a semiconductor substrate; over the first oxide insulating layer, forming a first oxide semiconductor layer which is amorphous and a second oxide semiconductor layer which has a crystalline structure; performing first heat treatment in an atmosphere of oxygen and nitrogen; forming a third oxide semiconductor layer which is amorphous over the second oxide semiconductor layer; forming a second oxide insulating layer over the third oxide semiconductor layer; and performing second heat treatment in an atmosphere of oxygen and nitrogen. Note that the semiconductor substrate may be provided with a transistor.

According one embodiment of the present invention, it is possible to provide a highly reliable semiconductor device that includes an oxide semiconductor and exhibits stable electrical characteristics. It is possible to fabricate a highly reliable semiconductor device.

DETAILED DESCRIPTION OF THE INVENTION

Figure 1:
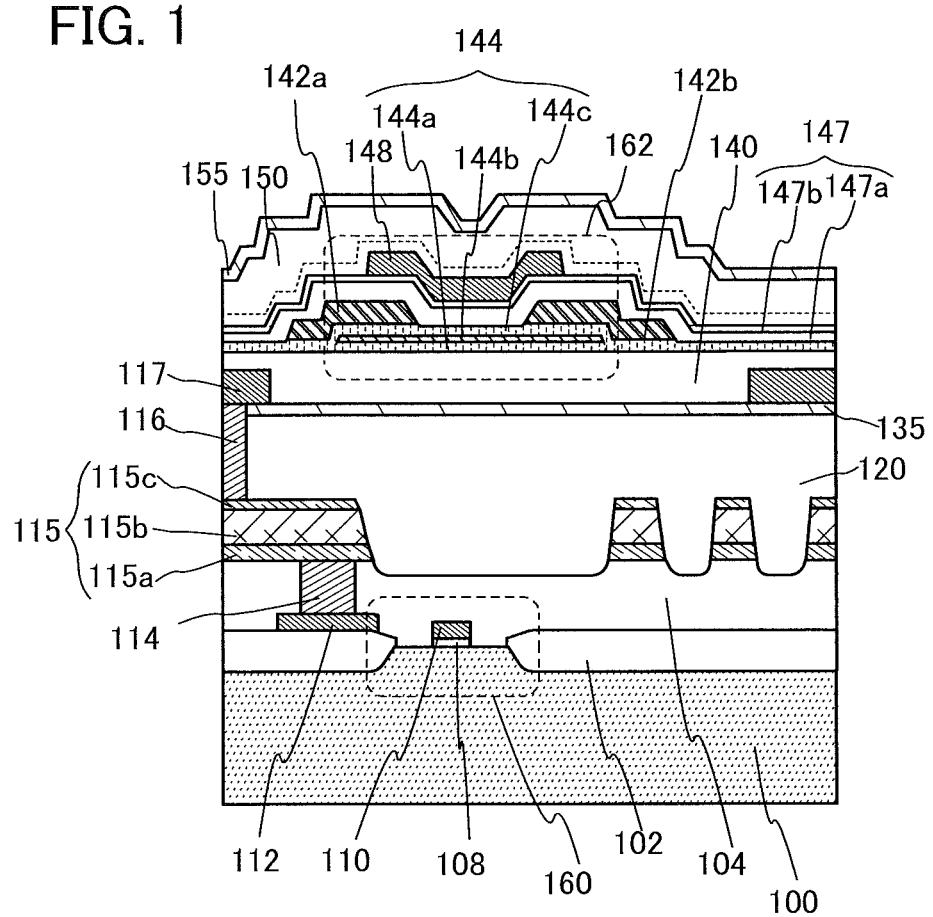
FIG. 1 is a cross-sectional view illustrating a semiconductor device according to one embodiment of the present invention.

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to description of the embodiments.

Further, in embodiments hereinafter described, the same parts are denoted with the same reference numerals throughout the drawings. Note that the thickness, width, relative positional relation, and the like of components, i.e., a layer, a region, and the like, which are illustrated in the drawings are exaggerated for clarification of descriptions of the embodiments in some cases.

Note that the term such as "over" in this specification and the like does not necessarily mean that a component is placed "directly on" another component. For example, the expression "a gate electrode layer over an insulating layer" does not exclude the case where there is an additional component between the insulating layer and the gate electrode layer. The same applies to the term "below".

In this specification and the like, the term "electrode layer" or "wiring layer" does not limit the function of components. For example, an "electrode layer" can be used as part of a "wiring layer", and the "wiring layer" can be used as part of the "electrode layer". In addition, the term "electrode layer" or "wiring layer" can also mean a combination of a plurality of "electrode layers" and "wiring layers", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are an electrode and a wiring.

Embodiment 1

In this embodiment, a semiconductor device according to one embodiment of the present invention is described in detail with reference to drawings. FIG. 1 illustrates a semiconductor device of one embodiment of the present invention.

In the semiconductor device, a transistor 160 including a first semiconductor material is formed on a substrate 100, and a transistor 162 including a second semiconductor material is formed over the transistor 160.

Here, the semiconductor materials included in the transistor 160 and the transistor 162 preferably have different band gaps. For example, a silicon-based semiconductor (single crystal silicon, polycrystalline silicon, or the like) can be used for the first semiconductor material, and an oxide semiconductor can be used for the second semiconductor material. A transistor including a silicon-based semiconductor can easily operate at high speed. A transistor including an oxide semiconductor, on the other hand, has low off-state current owing to its characteristics.

The transistor 160 illustrated in FIG. 1 includes a gate insulating layer 108 over the substrate 100 and a gate electrode layer 110 over the gate insulating layer 108. Note that the substrate 100 is provided with a channel formation region, a source region, and a drain region. An element isolation insulating layer 102 is provided to surround the transistor 160. A wiring layer 112 that is electrically connected to the transistor 160 is provided over the element isolation insulating layer 102.

Note that a sidewall insulating layer may be provided in contact with the side surface of the gate electrode layer 110 of the transistor 160. When the sidewall insulating layer is not provided as illustrated in FIG. 1, high integration can be achieved.

An insulating layer 104 is formed over the transistor 160, the element isolation insulating layer 102, and the wiring layer 112. An opening reaching the wiring layer 112 is formed in the insulating layer 104. A wiring layer 114 is formed in the opening. The wiring layer 114 can be formed in such a way that, after the opening is formed in the insulating layer 104, a conductive film is formed in the opening, and the insulating layer 104 and the conductive film are planarized by chemical mechanical polishing (CMP) or the like.

A wiring layer 115 is formed over the insulating layer 104. The wiring layer 115 has a stacked-layer structure of a wiring layer 115a, a wiring layer 115b, and a wiring layer 115c. However, the wiring layer 115 is not limited to this structure and may be provided in accordance with needed characteristics. An insulating layer 120 is provided over the wiring layer 115. The top surface of the insulating layer 120 is flat; thus, unevenness due to the transistor 160 and the wiring layer 115 is reduced.

An insulating layer 135 is provided over the insulating layer 120. The insulating layer 135 is formed using a film having a blocking property in order to inhibit the degradation in the characteristics of the transistor 160 which is caused by the release of hydrogen or the like from the transistor 162 and to prevent impurities due to the transistor 160 from entering the transistor 162. Here, examples of the impurities that enter the transistor 162 include hydrogen, moisture, and nitrogen. Thus, a film that does not transmit these impurities is preferably used for the insulating layer 135.

In an opening formed in the insulating layer 135 and the insulating layer 120, a wiring layer 116 is formed in contact with the wiring layer 115. A wiring layer 117 being in contact with the wiring layer 116 is formed over the insulating layer 135. An insulating layer 140 is formed over the wiring layer 117.

The insulating layer 140 may be a film which contains oxygen in excess of the stoichiometric composition. With the use of the insulating layer 140 containing oxygen in excess of in the stoichiometric composition, oxygen can be supplied to an oxide semiconductor stack 144 that is in contact with the insulating layer 140. Thus, oxygen vacancies of the oxide semiconductor stack 144 can be reduced.

The top surface of the insulating layer 140 is subjected to planarization treatment by chemical mechanical polishing or the like, so that unevenness due to the transistor 160, the wiring layer 115, the wiring layer 117, and the like is reduced. By the improvement in planarity of the top surface of the insulating layer 140, the oxide semiconductor stack 144 can be made uniform in thickness distribution and the characteristics of the transistor 162 can be improved.

The transistor 162 is formed over the insulating layer 140. The transistor 162 includes the oxide semiconductor stack 144, a source electrode layer 142a and a drain electrode layer 142b that are in contact with the oxide semiconductor stack 144, a gate insulating layer 147 over the oxide semiconductor stack 144, the source electrode layer 142a, and the drain electrode layer 142b, a gate electrode layer 148 over the gate insulating layer 147, an insulating layer 150 over the gate electrode layer 148, and an insulating layer 155.

In the oxide semiconductor stack 144, a first oxide semiconductor layer 144a, a second oxide semiconductor layer 144b, and a third oxide semiconductor layer 144c are stacked. The second oxide semiconductor layer 144b is formed using an oxide semiconductor having higher carrier density than the first oxide semiconductor layer 144a and the third oxide semiconductor layer 144c. Thus, a channel is formed in the second oxide semiconductor layer 144b having high carrier density, and the region where the channel is formed can be apart from the interface between the oxide semiconductor stack 144 and the insulating layer.

Further, the first oxide semiconductor layer 144a and the third oxide semiconductor layer 144c each have an amorphous structure, and the second oxide semiconductor layer 144b has a crystalline structure. A semiconductor film having a crystalline structure is used for the second oxide semiconductor layer 144b, whereby the effect of oxygen vacancies in the channel formation region can be reduced.

Note that the crystallinity of the first oxide semiconductor layer 144a is similar to the crystallinity of the third oxide semiconductor layer 144c; thus, the interface between the first oxide semiconductor layer 144a and the third oxide semiconductor layer 144c is not clearly observed in some cases. Hence, in drawings, the interface between the first oxide semiconductor layer 144a and the third oxide semiconductor layer 144c is indicated by a dotted line.

Next, a method for fabricating the semiconductor device of one embodiment of the present invention is described. First, an insulating film which is to be the gate insulating layer 108 is formed over the substrate 100.

A single crystal semiconductor substrate or a polycrystalline semiconductor substrate of silicon, silicon carbide, or the like or a compound semiconductor substrate of silicon germanium or the like may be used as the substrate 100. Alternatively, an SOI substrate, a semiconductor substrate over which a semiconductor element is provided, or the like can be used.

Further alternatively, a glass substrate of barium borosilicate glass, aluminoborosilicate glass, or the like, a ceramic substrate, a quartz substrate, a sapphire substrate, or the like over which a semiconductor layer is formed by a sputtering method, a vapor phase growth method such as a plasma CVD method, or the like may be used. As the semiconductor layer, any of the following can be used: amorphous silicon; polycrystalline silicon obtained by crystallization of amorphous silicon by laser annealing or the like; single crystal silicon obtained in such a manner that a surface portion of a single crystal silicon wafer is separated after implantation of hydrogen ions or the like into the silicon wafer; and the like. Any of these semiconductor layers may be processed into an island-like shape by a photolithography step.

A protective layer which is to be a mask for forming the element isolation insulating layer is formed, and etching is performed with the use of the protective layer as a mask, whereby a part of the substrate 100 which is not covered with the protective layer is removed. Thus, a plurality of isolated semiconductor regions is formed in an upper portion of the substrate 100. After an insulating layer is formed to cover the isolated semiconductor regions, the insulating layer which overlaps with the semiconductor regions is selectively removed. In this manner, the element isolation insulating layer 102 is formed.

Next, the gate insulating layer 108 and the gate electrode layer 110 are stacked. The gate insulating layer 108 can be formed by a sputtering method, a molecular beam epitaxy (MBE) method, a chemical vapor deposition (CVD) method, a pulsed laser deposition (PLD) method, an atomic layer deposition (ALD) method, or the like, as appropriate. When the gate insulating layer 108 is formed by a sputtering method, an impurity element such as hydrogen can be reduced.

The gate insulating layer 108 can be formed using an inorganic insulating film. It is preferable to use, for example, a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, or an aluminum nitride oxide film. Further, the gate insulating layer 108 can be formed with a single-layer structure or a stacked-layer structure including two or more layers with the use of these compounds.

The gate electrode layer 110 (and the wiring layer 112 formed using the same conductive film as the gate electrode layer 110, and the like) may be formed using a metal material such as molybdenum, titanium, tantalum, tungsten, aluminum, copper, chromium, neodymium, or scandium, or an alloy material containing any of these materials as its main component by a plasma CVD method, a sputtering method, or the like. The gate electrode layer 110 may also be formed using a semiconductor film typified by a polycrystalline silicon film doped with an impurity element such as phosphorus, or a silicide film of nickel silicide or the like. Further, the gate electrode layer 110 may also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 110 has a stacked-layer structure of the above conductive material and the above metal material.

Here, with the use of the gate electrode layer 110 as a mask, an impurity element imparting n-type conductivity or an impurity element imparting p-type conductivity is introduced to the substrate 100. Thus, a source region and a drain region are formed. As the method for introducing the impurity element, an ion implantation method, an ion doping method, a plasma immersion ion implantation method, or the like can be used.

Phosphorus, boron, nitrogen, arsenic, argon, aluminum, a molecular ion containing any of these elements, or the like can be used as the impurity element to be introduced. The dosage of such an element is preferably $1 \times 10^{13}$ ions/cm$^2$ to $5 \times 10^{16}$ ions/cm$^2$. When phosphorus is introduced as the impurity element, the acceleration voltage is preferably 0.5 kV to 80 kV.

Note that the treatment for introducing the impurity element may be performed plural times. In the case where the treatment for introducing the impurity element is performed plural times, the kind of impurity element may be the same in the plural treatments or different in every treatment.

By the above process, the transistor 160 can be fabricated.

Next, the insulating layer 104 is formed to cover the gate electrode layer 110, the gate insulating layer 108, the element isolation insulating layer 102, and the wiring layer 112.

The insulating layer 104 can be formed using a material and a method which are similar to those of the gate insulating layer 108.

Figure 2A:
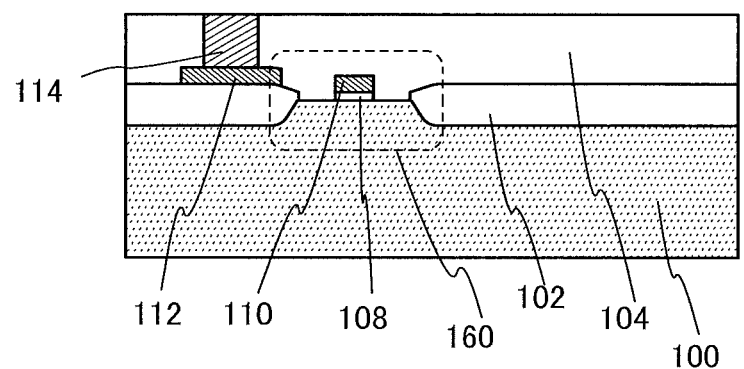
FIGS. 2A and 2B are views illustrating a method for fabricating a semiconductor device, according to one embodiment of the present invention.

Further, an opening is formed in the insulating layer 104, and the wiring layer 114 is formed in the opening (see FIG. 2A). The wiring layer 114 can be formed using a material and a method which are similar to those of the wiring layer 112.

Next, the wiring layer 115 is formed over the insulating layer 104. The wiring layer 115 can be formed using a material and a method which are similar to those of the wiring layer 112.

Here, in order to reduce the resistance of the wiring layer 115 and allow the wiring layer 115 to have heat resistance, the wiring layer 115 has a three-layer structure. In the three-layer structure, an aluminum film having low resistivity is used as the wiring layer 115b, and titanium films each having a high melting point are formed as the wiring layer 115a and the wiring layer 115c over and under the aluminum film.

Note that after conductive films to be the wiring layer 115 are formed, the conductive films are etched. In the step of etching the conductive films, the insulating layer 104 is also etched concurrently and is reduced in thickness in some cases. Hence, a region of the insulating layer 104 which overlaps with the wiring layer 115 has a larger thickness than the other region in some cases. Thus, a surface of the insulating layer 104 sometimes has unevenness.

Next, the insulating layer 120 is formed over the insulating layer 104 and the wiring layer 115. The insulating layer 120 can be formed using an inorganic material which is similar to that of the gate insulating layer 108 or an organic material such as a polyimide resin, an acrylic resin, or a benzocyclobutene-based resin so that unevenness due to the transistor 160, the insulating layer 104, and the wiring layer 115 is reduced. Other than such organic materials, it is also possible to use a low dielectric constant material (low-k material) or the like. Alternatively, the insulating layer 120 may be formed by stacking a plurality of insulating films formed using any of these materials.

Next, the insulating layer 135 is formed over the insulating layer 120.

The insulating layer 135 is preferably formed using a film having a blocking property so that impurities due to the transistor 160 do not enter the transistor 162. For example, the insulating layer 135 may be formed using a film containing silicon nitride, aluminum oxide, aluminum oxynitride, gallium oxide, gallium oxynitride, yttrium oxide, yttrium oxynitride, hafnium oxide, hafnium oxynitride, or the like.

Further, in the case where the insulating layer 135 includes a portion having low density or a portion where a film is not formed (hereinafter these portions are also collectively referred to as "cavity"), impurities enter the transistor through the cavity in some cases.

The planarity of the insulating layer 120 may be improved in advance so that the cavity is not formed in the insulating layer 135. For example, planarization treatment such as chemical mechanical polishing treatment or plasma treatment may be performed on a surface of the insulating layer 120 before the insulating layer 135 is formed.

After the insulating layer 135 is formed, an opening reaching the wiring layer 115 is formed in the insulating layer 135 and the insulating layer 120. The wiring layer 116 is formed in the opening. Over the insulating layer 135, the wiring layer 117 is formed in contact with the wiring layer 116. The wiring layers 116 and 117 can be formed using a material and a method which are similar to those of the gate electrode layer 110.

Figure 2B:
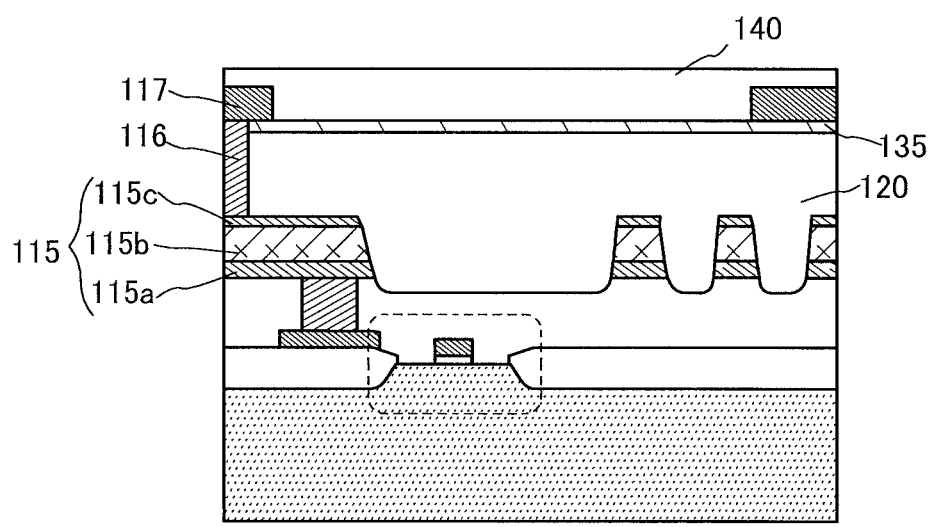

Next, the insulating layer 140 is formed over the wiring layer 117 (see FIG. 2B). The insulating layer 140 may be formed using an oxide insulating layer containing nitrogen or an oxide insulating layer such as a silicon oxide film, a silicon oxynitride film, an aluminum oxide film, an aluminum oxynitride film, a hafnium oxide film, or a gallium oxide film. Further, the insulating layer 140 can be formed with a single-layer structure or a stacked-layer structure including two or more layers with the use of these compounds. A film containing oxygen in excess of the stoichiometric composition may be used for the insulating layer 140 so as to supply oxygen to the oxide semiconductor stack 144 to be formed later.

Further, the insulating layer 140 may be planarized by chemical mechanical polishing treatment or the like so that the oxide semiconductor stack 144 to be formed later is made uniform in film thickness distribution and is improved in crystallinity.

Next, the oxide semiconductor stack 144 is formed over the insulating layer 140.

Each of the first to the third oxide semiconductor layers 144a to 144c is formed using a sputtering target which contains at least indium (In) and which allows film formation to be performed by an AC sputtering method or a DC sputtering method. By containing indium, the sputtering target can have increased conductivity. With the use of such a sputtering target, film formation by an AC sputtering method or a DC sputtering method is performed more easily. The target may be such that a film formed with the use of the target contains indium at a concentration higher than or equal to $1 \times 10^{19}$ atoms/cm$^3$ at least after the film is formed. The first oxide semiconductor layer 144a and the third oxide semiconductor layer 144c are each formed using a material that can be represented by $InM1_XZn_YO_Z$ ($X \geq 1$, $Y > 1$, $Z > 0$, and M1 is Ga, Hf, or the like). Note that in the case where the first oxide semiconductor layer 144a and the third oxide semiconductor layer 144c are each formed using a material containing Ga, a material containing a high proportion of Ga, or more specifically, a material that can be represented by $InM1_XZn_YO_Z$ where X is larger than 10 is not suitable because, in that case, dust might be generated at the time of film formation and it is difficult to perform film formation by an AC sputtering method or a DC sputtering method.

The second oxide semiconductor layer 144b is formed using a material that can be represented by $InM2_XZn_YO_Z$ ($X \geq 1$, $Y \geq X$, $Z > 0$, M2=Ga, Sn, or the like).

In particular, in the case where the second oxide semiconductor layer 144b is In-M2-Zn oxide (M2 is Ga, Sn, or the like) and a target having the atomic ratio of metal elements of In:M2:Zn=$x_1$:$y_1$:$z_1$ is used for forming the second oxide semiconductor layer 144b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the second oxide semiconductor layer 144b is easily formed. Typical examples of the atomic ratio of the metal elements of the target are In:M2:Zn=1:1:1 and In:M2:Zn=3:1:2.

Further, particularly in the case where each of the first oxide semiconductor layer 144a and the third oxide semiconductor layer 144c is In-M1-Zn oxide (M1 is Ga, Hf, or the like) and a target having the atomic ratio of the metal elements of In:M1:Zn=$x_2$:$y_2$:$z_2$ is used for forming each of the first oxide semiconductor layer 144*a* and the third oxide semiconductor layer 144*c*, it is preferable that $x_2/y_2 < x_1/y_1$ and that $z_2/y_2$ is greater than or equal to ⅓ and less than or equal to 6, further preferably greater than or equal to 1 and less than or equal to 6. Note that when $z_2/y_2$ is greater than or equal to 1 and less than or equal to 6, CAAC-OS films to be described later are easily formed as the first oxide semiconductor layer 144*a* and the third oxide semiconductor layer 144*c*. Typical examples of the atomic ratio of the metal elements of the target are In:M1:Zn=1:3:2, In:M1:Zn=1:3:4, In:M1:Zn=1:3:6, In:M1:Zn=1:3:8, and the like.

As the first to the third oxide semiconductor layers 144*a* to 144*c*, oxide having the atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), In:Ga:Zn=1:3:2 (=1/6:1/2:1/3), In:Ga:Zn=1:4:3 (=1/8:1/2:3/8), In:Ga:Zn=1:5:4 (=1/10:1/2:2/5), or In:Ga:Zn=1:6:6 (=1/13:6/13:6/13), or the like may be used. Note that the first and the third oxide semiconductor layers 144*a* and 144*c* may be formed using hafnium instead of gallium. Further, the second oxide semiconductor layer 144*b* may be formed using tin instead of gallium.

Materials of the first to the third oxide semiconductor layers are selected as appropriate so that a well-shaped structure is formed in which the bottom of the conduction band of the second oxide semiconductor layer 144*b* is deeper from the vacuum level than the bottoms of the conduction bands of the first and the third oxide semiconductor layers 144*a* and 144*c*. The depth of a bottom of a conduction band from a vacuum level (such depth can also be expressed as electron affinity) can be obtained by subtracting a difference in energy between the bottom of the conduction band and a top of a valence band (what is called a band gap) from a difference in energy between the vacuum level and the top of the valence band (what is called an ionization potential).

Figure 14A:
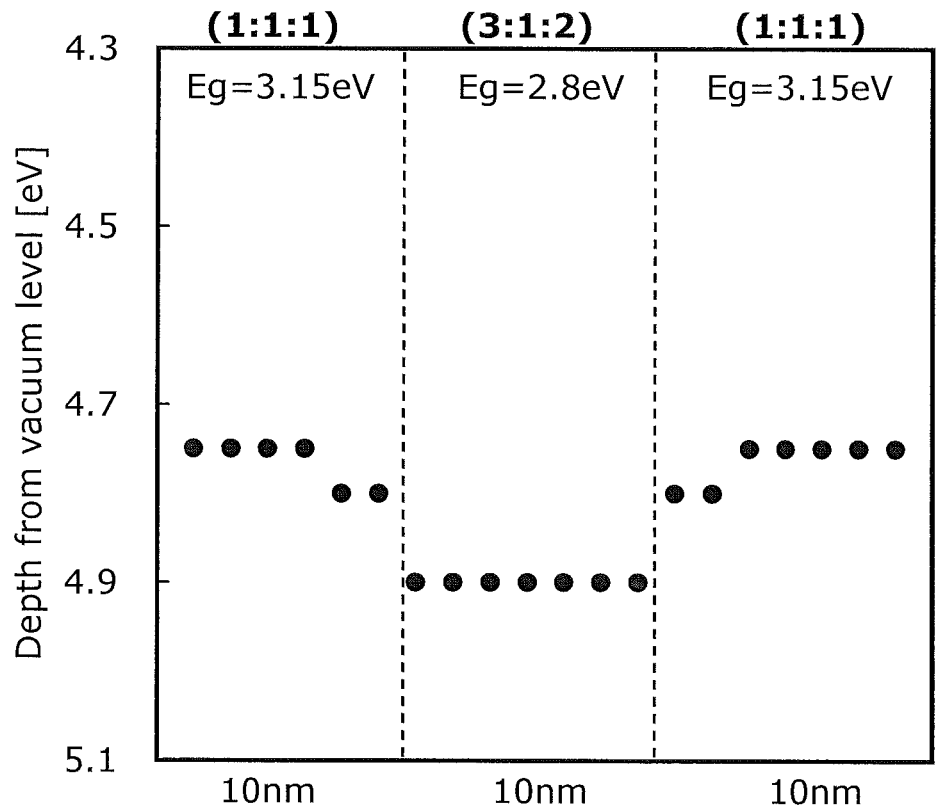
FIG. 14A shows energy from a vacuum level to a bottom of a conduction band of an oxide semiconductor stack.
Figure 14B:
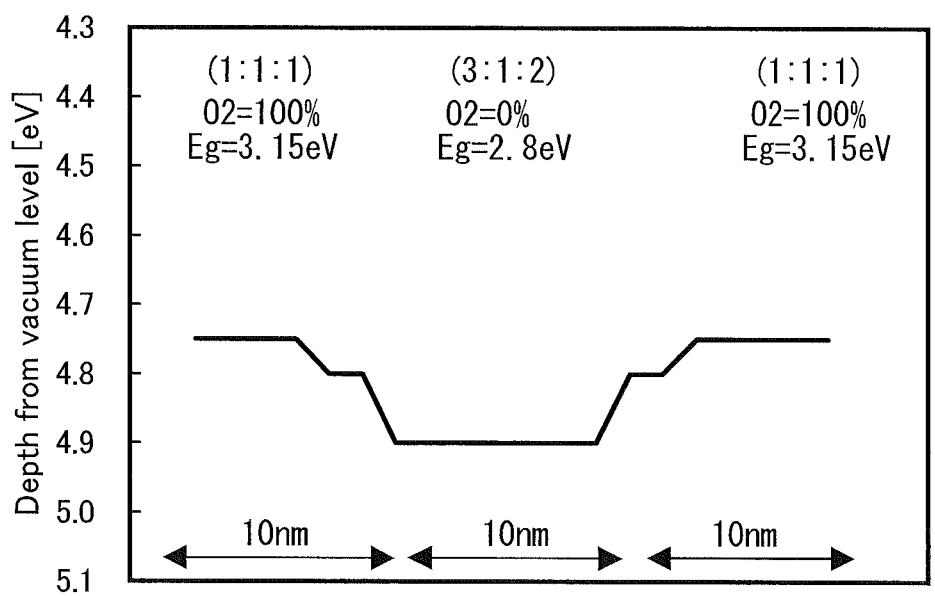
FIG. 14B is a band diagram thereof.

Note that the ionization potential of an oxide semiconductor which is used for obtaining electron affinity can be measured by ultraviolet photoelectron spectroscopy (UPS) or the like. As a typical measurement device of UPS, VersaProbe (manufactured by ULVAC-PHI, Inc) is used. The electron affinity refers to a difference in energy between the vacuum level ($E_v$) and an end of the conduction band ($E_c$). Further, energy band gap ($E_g$) can be measured by a full automatic spectroscopic ellipsometer UT-300. The energy of the bottom of the conduction band is obtained by subtracting the energy band gap from the value of the ionization potential, and thus, the band structure of a single layer or stacked layers can be formed. By using this method, it can be confirmed whether a buried channel is formed with the use of the stacked-layer structure disclosed in this specification. FIGS. 14A and 14B each illustrate an example thereof.

FIG. 14A shows data of energy from the vacuum level to the bottom of the conduction band. FIG. 14B shows the band structure formed on the basis of the data. To obtain the data, a sample with a stacked-layer structure is formed in such a manner that, after a 10 nm thick film is formed using an In—Ga—Zn oxide sputtering target having a composition of In:Ga:Zn=1:1:1 [atomic ratio] under an atmosphere where the proportion of oxygen is 100%, a 10 nm thick film is formed using an In—Ga—Zn oxide sputtering target having a composition of In:Ga:Zn=3:1:2 [atomic ratio] under an atmosphere where the proportion of argon is 100%, and then, a 10 nm thick film is formed using an In—Ga—Zn oxide sputtering target having a composition of In:Ga:Zn=1:1 [atomic ratio] under an atmosphere where the proportion of oxygen is 100%. With the use of the sample, an ionization potential is measured, and an energy band gap is measured by a full automatic spectroscopic ellipsometer UT-300. The energy from the vacuum level to the bottom of the conduction band is obtained by subtracting the energy band gap from the ionization potential. It is found from FIG. 14B that a well-shaped structure is formed in which the bottom of the conduction band of the second oxide semiconductor layer is deeper from the vacuum level than the bottoms of the conduction bands of the first and the third oxide semiconductor layers.

Further, in the case where the first to the third oxide semiconductor layers 144*a* to 144*c* are formed using an In—Ga—Zn oxide, the constituent elements of the first to the third oxide semiconductor layers 144*a* to 144*c* are the same. Hence, the number of trap levels at the interface between the first oxide semiconductor layer 144*a* and the second oxide semiconductor layer 144*b* and the interface between the second oxide semiconductor layer 144*b* and the third oxide semiconductor layer 144*c* is small. Thus, it is possible to reduce a change of a transistor over time and a change in threshold voltage due to stress test.

In Ga, the formation energy of oxygen vacancies is larger and thus oxygen vacancies are less likely to occur, than in In; therefore, the oxide having a composition in which the proportion of In is equal to or lower than that of Ga has more stable characteristics than the oxide having a composition in which the proportion of In is higher than that of Ga. Hence, the interface between the first oxide semiconductor layer 144*a* and a silicon insulating layer and the interface between the third oxide semiconductor layer 144*c* and a silicon insulating layer can be stable. Thus, a highly reliable semiconductor device can be obtained.

In an oxide semiconductor, the s orbital of heavy metal mainly contributes to carrier transfer, and when the proportion of In in the oxide semiconductor is increased, overlap of the s orbital is likely to be increased. Therefore, oxide having a composition in which the proportion of In is higher than that of Ga has higher mobility than oxide having a composition in which the proportion of In is equal to or lower than that of Ga. Hence, when a carrier is formed in the second oxide semiconductor layer 144*b* containing a high proportion of indium, high mobility can be achieved.

Figure 12A:
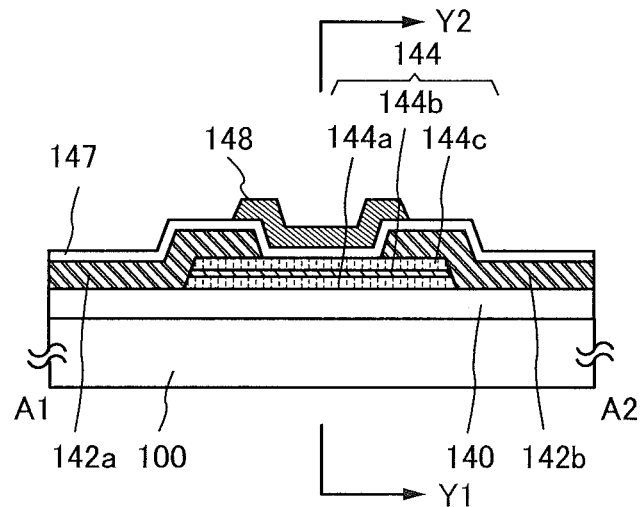
FIG. 12A is a view illustrating an oxide semiconductor stack included in a semiconductor device according to one embodiment of the present invention.
Figure 12B:
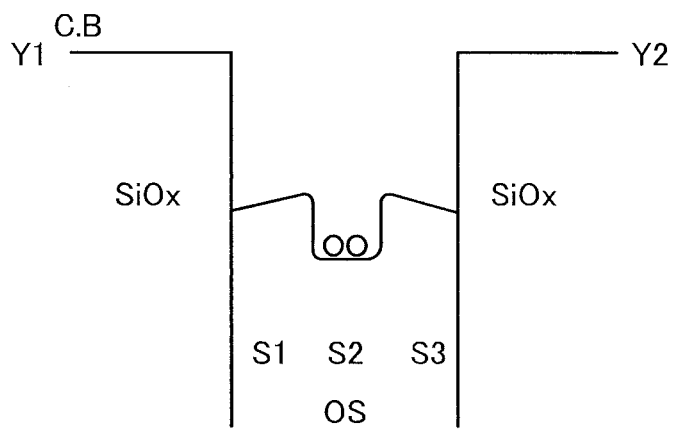
FIG. 12B is a band diagram of the oxide semiconductor stack.

A material of the second oxide semiconductor layer 144*b* is selected as appropriate so that the bottom of the conduction band of the second oxide semiconductor layer 144*b* forms a well-shaped structure. An example of the well-shaped structure is illustrated in FIG. 12B. FIG. 12B is an energy band diagram along Y1-Y2 in a transistor illustrated in FIG. 12A. Note that the transistor illustrated in FIG. 12A has a structure similar to that of a transistor 163 illustrated in FIG. 4A; therefore, a detailed description thereof is omitted.

Further, if silicon or carbon which is one of Group 14 elements is contained as an impurity in the oxide semiconductor layer, it can work as a donor and form an n-type region. Thus, the concentration of Si in each oxide semiconductor layer is less than or equal to $3 \times 10^{18}$ atoms/cm$^3$, preferably less than or equal to $3 \times 10^{17}$ atoms/cm$^3$. In particular, it is preferable to use a structure in which the first oxide semiconductor layer 144*a* and the third oxide semiconductor layer 144*c* sandwich or surround the second oxide semiconductor layer 144*b* to be a carrier path so that Group 14 elements are prevented from being contained at a high proportion in the second oxide semiconductor layer 144*b*. That is to say, the first and the third oxide semiconductor layer 144a and 144c can also be called barrier layers which prevent Group 14 elements such as silicon from entering the second oxide semiconductor layer 144b.

Hydrogen contained in the oxide semiconductor stack 144 reacts with oxygen bonded to metal to produce water, and a defect is formed in a lattice from which oxygen is released (or a portion from which oxygen is removed). In addition, a bond of a part of hydrogen and oxygen causes generation of electrons serving as carriers. Thus, the impurities containing hydrogen are reduced as much as possible in the step of forming the oxide semiconductor stack 144, whereby the hydrogen concentration in the oxide semiconductor stack 144 can be reduced. When the oxide semiconductor stack 144 which is highly purified by removing hydrogen as much as possible is used as the channel formation region, a shift of the threshold voltage in the negative direction can be reduced, and the leakage current between a source and a drain of the transistor (typically, the off-state current or the like) can be decreased to several yoctoamperes per micrometer to several zeptoamperes per micrometer. As a result, electric characteristics of the transistor can be improved.

When the oxide semiconductor films to be semiconductor layers of the transistor have the above-described stacked-layer structure, in the region where the channel is formed, an absorption coefficient due to the localized states measured by a constant photocurrent method (CPM) can be lower than or equal to $3 \times 10^{-3}$/cm (lower than or equal to $3 \times 10^{13}$/cm$^3$ when converted into density of states).

Figure 12C:
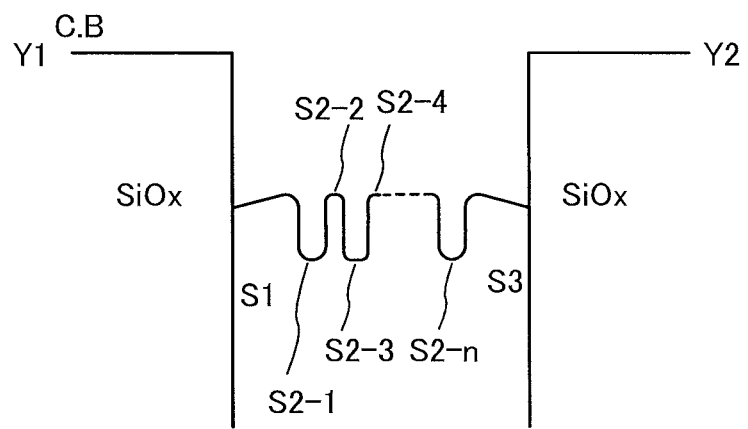
FIG. 12C is a band diagram of an oxide semiconductor stack included in a semiconductor device according to another embodiment of the present invention.

The above-described stacked-layer structure is an example in which one well-shaped structure is formed using the first to the third oxide semiconductor layers; however, the present invention is not limited to the above-described stacked layer structure. A plurality of well-shaped structures may be formed using the second oxide semiconductor layer with a multilayer structure. FIG. 12C illustrates an example thereof.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas.

The target for forming the oxide semiconductor layer may be selected as appropriate in accordance with the composition of the oxide semiconductor layer to be formed.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

Here, the details of the CAAC-OS film are described. The CAAC-OS film is one of oxide semiconductor films having a plurality of c-axis aligned crystal parts. In an image obtained with a transmission electron microscope (TEM), a grain boundary in the CAAC-OS film cannot be found. Thus, in the CAAC-OS film, a reduction in electron mobility due to the grain boundary is less likely to occur.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 µm$^2$ or more, or 1000 µm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

In an oxide semiconductor having a crystal part as the CAAC-OS film, defects in the bulk can be further reduced and when the surface flatness of the oxide semiconductor is improved, mobility higher than that of an oxide semiconductor in an amorphous state can be obtained. In order to improve the surface planarity, the oxide semiconductor is preferably formed over a flat surface.

When a CAAC-OS film is formed, for example, the CAAC-OS film is formed by a sputtering method using a polycrystalline oxide semiconductor sputtering target. By collision of ions with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

Next, a microcrystalline oxide semiconductor film will be described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a beam diameter larger than that of a crystal part, a peak which shows a crystal plane does not appear. Further, a halo pattern is shown in a selected-area electron diffraction pattern of the nc-OS film obtained by using an electron beam having a probe diameter (e.g., larger than or equal to 50 nm) larger than that of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

Here, by the above-described method, the first oxide semiconductor layer 144a and the second oxide semiconductor layer 144b are stacked, and then, heat treatment is performed, and selective etching is performed with the use of a mask.

In this embodiment, the first oxide semiconductor layer 144a having an amorphous structure is formed under the condition where the substrate temperature is set to room temperature and a target having an atomic ratio of In:Ga:Zn=1:3:2 is used. The thickness of the first oxide semiconductor layer 144a having an amorphous structure is greater than or equal to 10 nm and less than or equal to 40 nm, preferably greater than or equal to 20 nm and less than or equal to 30 nm. The first oxide semiconductor layer 144a having an amorphous structure has such a large film thickness; thus, entry of silicon or the like into the second oxide semiconductor layer 144b can be prevented.

Further, the second oxide semiconductor layer 144b having a crystalline structure is formed under the condition where the substrate temperature is set to 400° C. and a target having an atomic ratio of In:Ga:Zn=1:1:1 is used. The second oxide semiconductor layer 144b is a film containing a crystal whose c-axis is aligned in a direction approximately perpendicular to a surface, preferably a CAAC-OS film. The second oxide semiconductor layer 144b has a thickness greater than or equal to 5 nm and less than or equal to 10 nm. The film formation temperature of the second oxide semiconductor layer 144b is higher than or equal to 400° C. and lower than or equal to 550° C., preferably higher than or equal to 450° C. and lower than or equal to 500° C. Note that the film formation is performed at temperatures that the wiring layers already formed can withstand.

The second oxide semiconductor layer 144b having a crystalline structure is stacked over the first oxide semiconductor layer 144a having an amorphous structure. Hence, the stack can be also referred to as a heterostructure.

The heat treatment after the film formation is performed under reduced pressure in an atmosphere of nitrogen, oxygen, or nitrogen and oxygen at a temperature higher than or equal to 150° C. and lower than the strain point of the substrate, preferably higher than or equal to 250° C. and lower than or equal to 450° C., further preferably higher than or equal to 300° C. and lower than or equal to 450° C. By the heat treatment, excess hydrogen (including water or a hydroxyl group) in the oxide semiconductor layer is removed (dehydration or dehydrogenation). Further, a high-purity oxygen gas or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature after the termination of the heat treatment is maintained or slow cooling is performed to lower the temperature from the heating temperature. By the effect of the oxygen gas, oxygen which is a main component of the oxide semiconductor and which has been reduced at the same time as the step for removing impurities by dehydration or dehydrogenation is supplied.

The heat treatment is performed after the second oxide semiconductor layer 144b is formed, whereby the hydrogen concentration in the second oxide semiconductor layer 144b can be lower than $5 \times 10^{18}$ atoms/cm$^3$, preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours. The number of times of the heat treatment performed on the oxide semiconductor layer is not limited, and the timing of the heat treatment is not limited.

Note that heating may be performed with the oxide insulating layer provided over and/or under the oxide semiconductor stack 144, in which case oxygen is supplied from the oxide insulating layer to the oxide semiconductor stack 144 to reduce oxygen defects in the oxide semiconductor stack 144. The reduction of the oxygen defects in the oxide semiconductor stack 144 leads to favorable semiconductor characteristics.

Figure 3A:
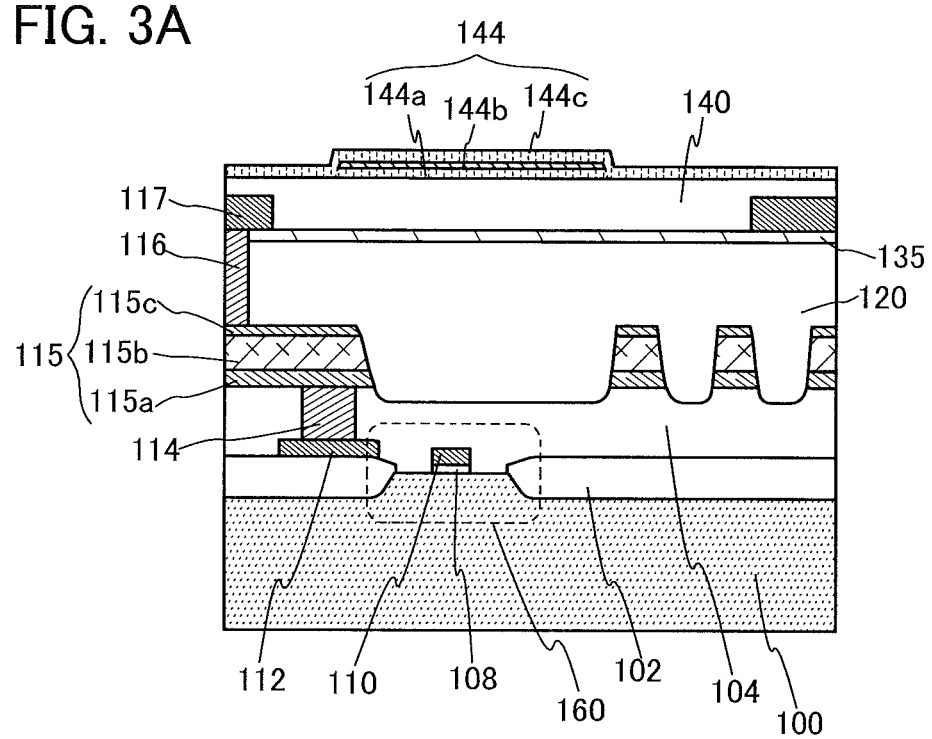
FIGS. 3A and 3B are views illustrating a method for fabricating a semiconductor device, according to one embodiment of the present invention.

Next, the third oxide semiconductor layer 144c is formed to cover the top surface and the side surfaces of the second oxide semiconductor layer 144b and the side surfaces of the first oxide semiconductor layer 144a (see FIG. 3A). The heat treatment for dehydration or dehydrogenation of the oxide semiconductor may be performed also after the third oxide semiconductor layer 144c is formed.

The third oxide semiconductor layer 144c is formed using a target having an atomic ratio of In:Ga:Zn=1:3:2 at a substrate temperature of room temperature. The third oxide semiconductor layer 144c is formed under the film formation conditions which are substantially the same as those for the first oxide semiconductor layer 144a. The whole of the third oxide semiconductor layer 144c has an amorphous structure. The thickness of the third oxide semiconductor layer 144c is greater than or equal to 10 nm and less than or equal to 40 nm, preferably greater than or equal to 20 nm and less than or equal to 30 nm.

The third oxide semiconductor layer 144c is amorphous. The third oxide semiconductor layer 144c having an amorphous structure is stacked over the second oxide semiconductor layer 144b having a crystalline structure. Therefore, the stack can be also referred to as a heterostructure.

The third oxide semiconductor layer 144c can be formed under conditions which are similar to those for the first oxide semiconductor layer 144a. Note that the first oxide semiconductor layer 144a and the third oxide semiconductor layer 144c have the same composition and crystallinity. Thus, the interface between the first oxide semiconductor layer 144a and the third oxide semiconductor layer 144c is not clearly observed in some cases. Hence, in drawings, the interface between the first oxide semiconductor layer 144a and the third oxide semiconductor layer 144c is indicated by a dotted line.

The second oxide semiconductor layer 144b to be the channel formation region is sandwiched between the first oxide semiconductor layer 144a and the third oxide semiconductor layer 144c which are amorphous, or the second oxide semiconductor layer 144b to be the channel formation region is surrounded by the first oxide semiconductor layer 144a and the third oxide semiconductor layer 144c which are amorphous. Thus, internal stress or external stress of the oxide semiconductor stack 144 can be relieved, variation in characteristics of the transistor can be reduced, and the reliability of the transistor can be further improved.

Further, the second oxide semiconductor layer 144b to be the carrier path is formed using the CAAC-OS film having a crystalline structure, and the first and the third oxide semiconductor layers 144a and 144c each have an amorphous structure; thus, the channel can be favorably formed in the second oxide semiconductor layer 144b.

Next, a conductive film to be the source electrode layer 142a and the drain electrode layer 142b is formed over the oxide semiconductor stack 144. The conductive film can be formed using a material and a method which are similar to those of the gate electrode layer 110.

Note that in etching at the time of forming the source electrode layer 142a and the drain electrode layer 142b, a region of the oxide semiconductor stack 144 which is located between the source electrode layer 142a and the drain electrode layer 142b is also etched concurrently and is reduced in thickness in some cases. Thus, a region of the oxide semiconductor stack 144 which does not overlap with the source electrode layer 142a and the drain electrode layer 142b has a smaller thickness than a region overlapping with the source electrode layer 142a and the drain electrode layer 142b in some cases.

In the oxide semiconductor stack 144, the second oxide semiconductor layer 144b to be the channel formation region is sandwiched between the first oxide semiconductor layer 144a and the third oxide semiconductor layer 144c. Hence, even when the oxide semiconductor stack 144 is etched concurrently with the etching of the source electrode layer 142a and the drain electrode layer 142b, the second oxide semiconductor layer 144b to be the channel formation region is hardly affected by the etching, and there is little possibility that the channel formation region is etched and reduced in thickness. Thus, stable characteristics can be exhibited.

Next, the oxide insulating layer to be used for the gate insulating layer 147 is forming over the source electrode layer 142a and the drain electrode layer 142b. Here, the gate insulating layer 147 has a two-layer structure in which a gate insulating layer 147a including the oxide insulating layer and a gate insulating layer 147b including a nitride insulating layer are stacked.

The oxide insulating layer to be used for the gate insulating layer 147a can be formed using a material and a method which are similar to those of the insulating layer 140. In particular, a film formation condition causing less plasma damage may be used for forming the gate insulating layer 147a in order to reduce plasma damage to the oxide semiconductor stack 144. Further, since the gate insulating layer 147a is in contact with the oxide semiconductor stack 144, the gate insulating layer 147a may be formed using a film which contains oxygen in excess of the stoichiometric composition and from which oxygen is easily released by heat treatment so that oxygen can be supplied to the oxide semiconductor stack 144.

An insulating film which can be used for the gate insulating layer 147b may be formed using a silicon film containing oxygen and nitrogen such as a silicon nitride oxide silicon film or a silicon oxynitride film.

Next, the gate electrode layer 148 is formed over the gate insulating layer 147. The gate electrode layer 148 can be formed using a material and a method which are similar to those of the gate electrode layer 110.

The insulating layer 150 is formed over the gate electrode layer 148. The insulating layer 150 can be formed using a material and a method which are similar to those of the insulating layer 140. The insulating layer 150 preferably contains oxygen in excess of the stoichiometric composition so that oxygen can be supplied to the oxide semiconductor stack 144.

Oxygen may be added to the insulating layer 150 by an ion implantation method, an ion doping method, a plasma immersion ion implantation method, or the like. By the addition of oxygen, excess oxygen can be contained in the insulating layer 150 and oxygen can be supplied from the insulating layer 150 to the oxide semiconductor stack 144. Note that, in drawings, a dotted line is drawn in the insulating layer 150 to illustrate clearly that oxygen is added to the insulating layer 150 and an oxygen concentration has a peak in the insulating layer 150.

After the insulating layer 150 is formed, heat treatment is performed. The oxide semiconductor stack 144 includes oxygen vacancies formed by damage due to plasma or etching which is performed after the oxide semiconductor stack 144 is formed. Hence, in order to repair the damage caused after the oxide semiconductor stack is formed, the heat treatment is performed to supply oxygen, whereby oxygen vacancies are reduced. The temperature of the heat treatment is typically higher than or equal to 200° C. and lower than or equal to 450° C. By the heat treatment, nitrogen in the oxide insulating layer containing nitrogen can be released. Note that by the heat treatment, water, hydrogen, or the like can be released from the oxide insulating layer containing nitrogen.

For example, heat treatment is performed in a mixed atmosphere of nitrogen and oxygen at 350° C. for one hour. By the heat treatment, hydrogen atoms and oxygen atoms in the oxide semiconductor stack 144 are released from the oxide semiconductor stack 144 or the interface between the oxide semiconductor stack 144 and each of the insulating layers (the insulating layer 140 and the gate insulating layer 147). In the oxide semiconductor stack 144, sites from which oxygen atoms are released become oxygen vacancies. However, oxygen atoms contained in the oxide insulating layer, which are in excess of the stoichiometric composition, move to the sites of the oxygen vacancies, and the oxygen vacancies are filled with the oxygen atoms.

In this manner, nitrogen, hydrogen, or water is released from the oxide semiconductor layer by the heat treatment performed after the insulating layer 150 is formed, whereby the proportion of nitrogen, hydrogen, or water in the film can be reduced to about a tenth.

The insulating layer 155 is formed over the insulating layer 150. The insulating layer 155 can be formed using a material and a method which are similar to those of the insulating layer 135. The insulating layer 155 can inhibit entry of an impurity from the top of the semiconductor device into the oxide semiconductor stack 144 or can inhibit release of oxygen in the oxide semiconductor stack 144 and the insulating layer 150 to the outside from the top of the semiconductor device.

Figure 3B:
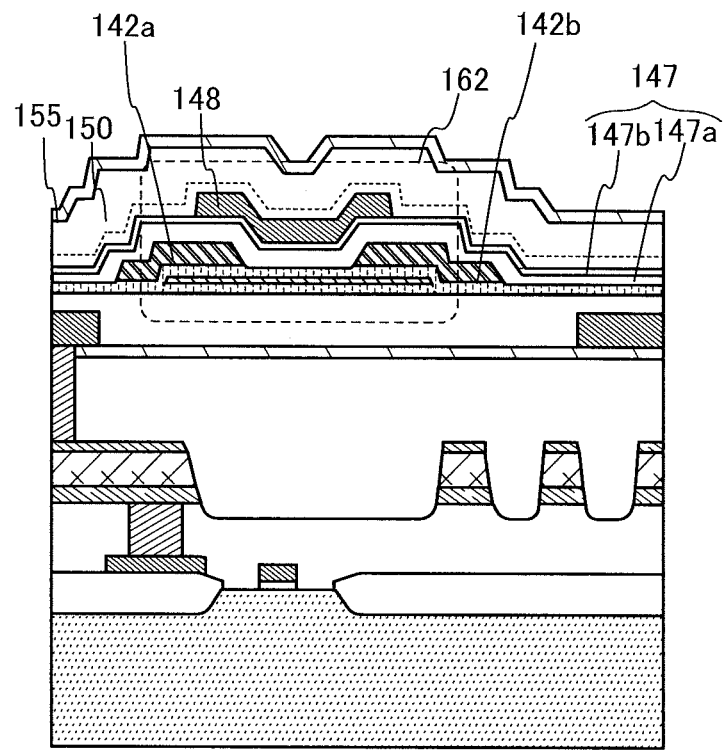

By the aforementioned process, the semiconductor device can be fabricated (see FIG. 3B).

In the semiconductor device described in this embodiment, the second oxide semiconductor layer 144b to be the channel formation region is sandwiched between the first oxide semiconductor layer 144a and the third oxide semiconductor layer 144c. Thus, the channel formation region can be apart from a surface of the oxide semiconductor stack 144, which leads to a reduction in the effect of surface scattering.

Further, the insulating layers containing oxygen in excess of the stoichiometric composition is formed so that the oxide semiconductor stack 144 is sandwiched therebetween. Hence, oxygen is supplied to the oxide semiconductor stack 144 and an oxygen vacancy in the oxide semiconductor stack 144 is filled with the oxygen. Thus, a highly reliable semiconductor device can be obtained.

In addition, the nitride insulating films each having a property of blocking hydrogen or oxygen are formed so that the insulating layers containing excess oxygen are sandwiched therebetween. Hence, it is possible to inhibit entry of an impurity such as hydrogen or moisture into the oxide semiconductor stack 144 or inhibit release of oxygen from the oxide semiconductor layers and the insulating layers containing excess oxygen.

Note that the above-described structure is not necessarily used for a second transistor of the semiconductor device described in this embodiment. For example, another mode of the semiconductor device of one embodiment of the present invention is illustrated in each of FIGS. 4A and 4B and FIGS. 5A to 5C. Note that in FIGS. 4A and 4B and FIGS. 5A to 5C, only the second transistor is illustrated, and a first transistor, the wiring layer, and the like are omitted.

Figure 4A:
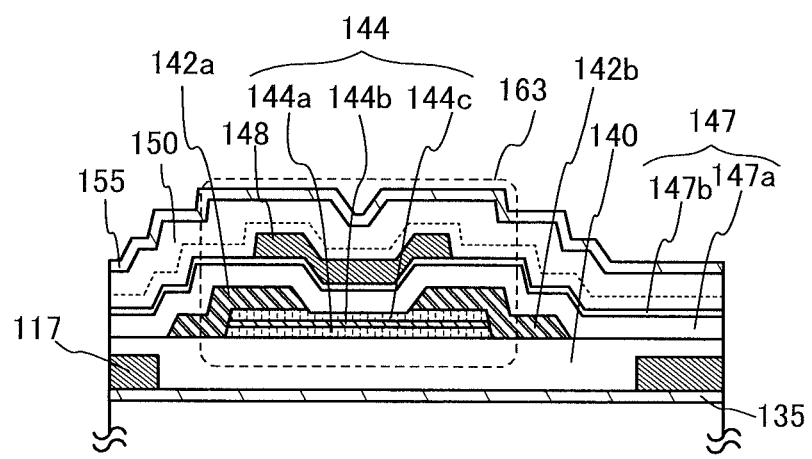
FIGS. 4A and 4B are cross-sectional views each illustrating a semiconductor device according to one embodiment of the present invention.

The transistor 163 illustrated in FIG. 4A is different from the transistor 162 illustrated in FIG. 1 in that the third oxide semiconductor layer 144c does not cover the side surfaces of the second oxide semiconductor layer 144b and the side surfaces of the first oxide semiconductor layer 144a. The transistor 163 can be formed in such a manner that, after the first oxide semiconductor layer 144a, the second oxide semiconductor layer 144b, and the third oxide semiconductor layer 144c are successively formed without exposure to the air, etching is performed with the use of a mask such that the oxide semiconductor stack 144 has an island shape. Thus, a surface of the second oxide semiconductor layer 144b is not exposed to the air and is not subjected to etching treatment; hence, stable characteristics can be provided.

Further, since the third oxide semiconductor layer 144c is etched, the gate insulating layer 147 (the gate insulating layer 147a) and the insulating layer 140 are in contact with each other, and thus, the oxide semiconductor stack 144 can be surrounded by the oxide insulating layers. Furthermore, with the oxide insulating layers which are in contact with each other, adhesion can be improved.

Figure 13:
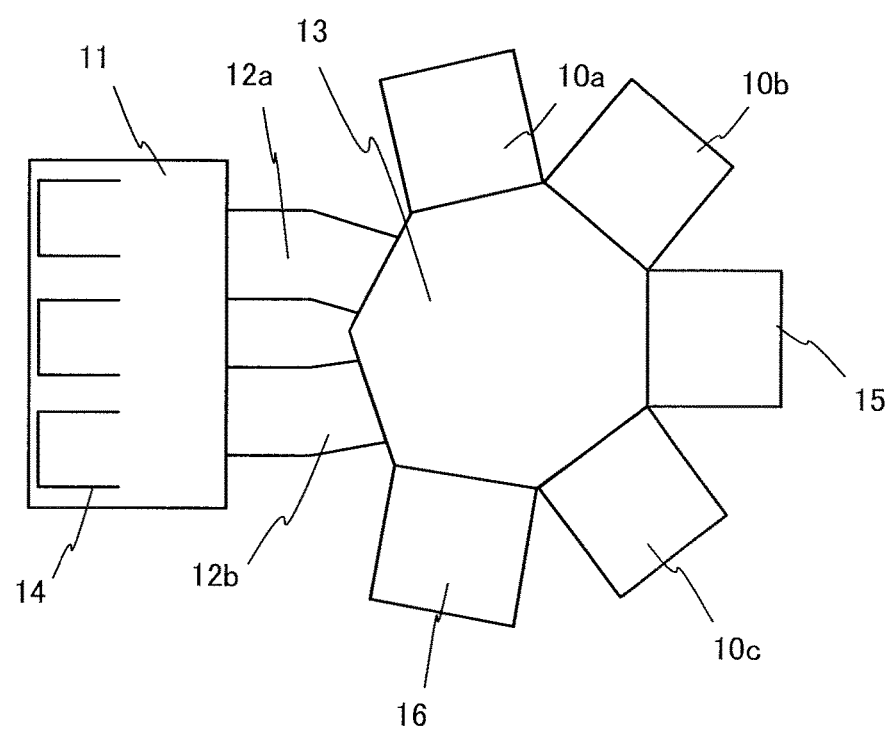
FIG. 13 is a top view illustrating an example of an apparatus for fabricating a semiconductor device.

In the case where the three oxide semiconductor layers are formed in succession without exposure to the air, a manufacturing apparatus a top view of which is illustrated in FIG. 13 may be employed.

The manufacturing apparatus illustrated in FIG. 13 is single wafer multi-chamber equipment, which includes three sputtering devices 10a, 10b, and 10c, a substrate supply chamber 11 provided with three cassette ports 14 for holding a process substrate, load lock chambers 12a and 12b, a transfer chamber 13, substrate heating chambers 15 and 16, and the like. Note that a transfer robot for transferring a process substrate is provided in each of the substrate supply chamber 11 and the transfer chamber 13. Atmospheres of the sputtering devices 10a, 10b, and 10c, the transfer chamber 13, and the substrate heating chambers 15 and 16 are preferably controlled so as to hardly contain hydrogen or moisture (i.e., so as to be an inert atmosphere, a reduced pressure atmosphere, a dry air atmosphere, or the like). For example, a preferable atmosphere is a dry nitrogen atmosphere in which the dew point of moisture is −40° C. or lower, preferably −50° C. or lower. An example of a procedure of the manufacturing steps with use of the manufacturing apparatus illustrated in FIG. 13 is as follows. A process substrate is transferred from the substrate supply chamber 11 to the substrate heating chamber 15 through the load lock chamber 12a and the transfer chamber 13; moisture attached to the process substrate is removed by vacuum baking or the like in the substrate heating chamber 15; the process substrate is transferred to the sputtering device 10c through the transfer chamber 13; and the first oxide semiconductor layer 144a is formed in the sputtering device 10c. Then, the process substrate is transferred to the sputtering device 10a through the transfer chamber 13 without exposure to the air, and the second oxide semiconductor layer 144b is formed in the sputtering device 10a. Then, the process substrate is transferred to the sputtering device 10b through the transfer chamber 13 without exposure to the air, and the third oxide semiconductor layer 144c is formed in the sputtering device 10b. If necessary, the process substrate is transferred to the substrate heating chamber 16 though the transfer chamber 13 without exposure to the air and subjected to heat treatment. As described above, with use of the manufacturing apparatus illustrated in FIG. 13, a manufacturing process can proceed without the process substrate being exposed to the air. Further, with the use of the sputtering devices in the manufacturing apparatus in FIG. 13, a process performed without exposure to the air can be achieved by change of the sputtering target. As the sputtering devices in the manufacturing apparatus in FIG. 13, a parallel plate sputtering device, an ion beam sputtering device, a facing-target type sputtering device, or the like may be used. In a facing-target type sputtering device, an object surface is separated from plasma and thus damage in film formation is small; therefore, a CAAC-OS film having high crystallinity can be formed.

A high-purity gas in which the concentration of impurities such as hydrogen, water, a hydroxyl group, or hydride is low is used as a deposition gas for forming the oxide semiconductor layers in the sputtering devices 10a, 10b, and 10c.

The heating treatment may be performed in the substrate heating chamber 16 under reduced pressure, under a nitrogen atmosphere, under an oxygen atmosphere, in ultra dry air (air in which the moisture amount is less than or equal to 20 ppm (−55° C. by conversion into a dew point), preferably less than or equal to 1 ppm, further preferably less than or equal to 10 ppb, in the measurement with the use of a dew point meter in the cavity ring down laser spectroscopy (CRDS) system), or under a rare gas (argon, helium, or the like) atmosphere. It is preferable that water, hydrogen, and the like be not contained in the nitrogen atmosphere, in the oxygen atmosphere, in the ultra dry air, in the rare gas atmosphere, or the like. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

Figure 4B:
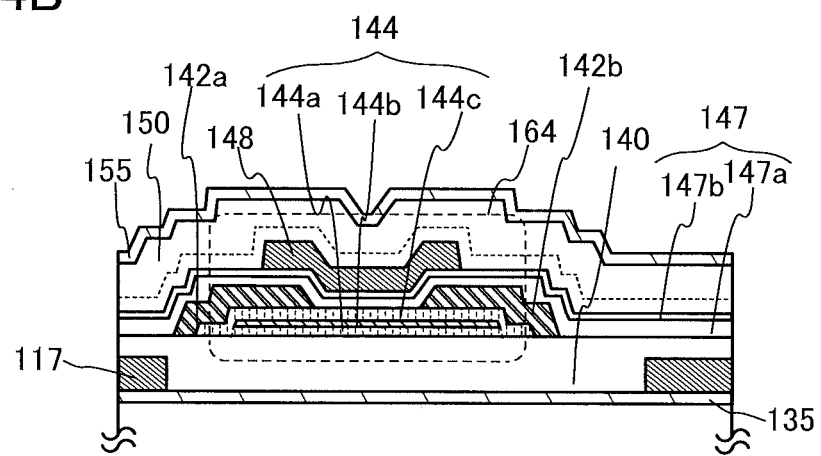

A transistor 164 illustrated in FIG. 4B is similar to the transistor 162 in that the third oxide semiconductor layer 144c covers the top surface and the side surfaces of the second oxide semiconductor layer 144b and the side surfaces of the first oxide semiconductor layer 144a. However, the transistor 164 is different from the transistor 162 in that the third oxide semiconductor layer 144c is etched so that the edge portions of the third oxide semiconductor layer 144c overlap with the source electrode layer 142a and the drain electrode layer 142b. With such a structure, the side surfaces of the second oxide semiconductor layer 144b can be covered with the third oxide semiconductor layer 144c, and the insulating layer 140 can be in contact with the gate insulating layer 147.

Further, the second transistor may have a structure including two gate electrode layers. Transistors each including two gate electrode layers are illustrated in FIGS. 5A to 5C.

Figure 5A:
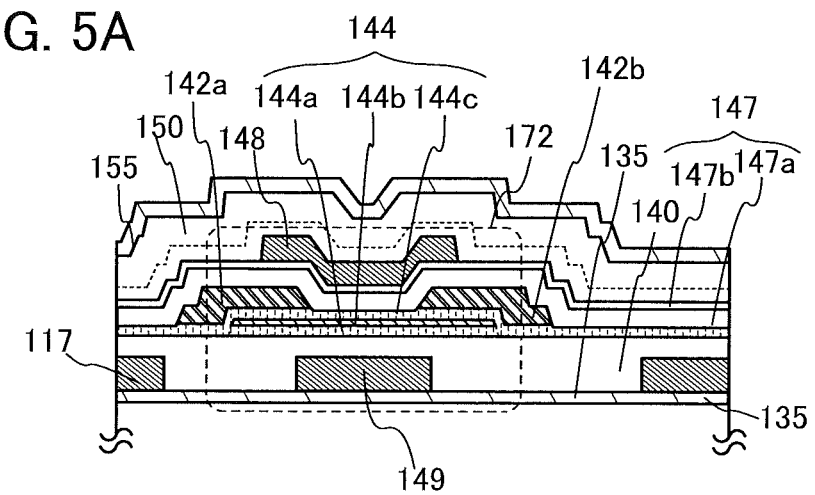
FIGS. 5A to 5C are cross-sectional views each illustrating a semiconductor device according to one embodiment of the present invention.

A transistor 172 illustrated in FIG. 5A has the structure in which a gate electrode layer 149 is added to the transistor 162 in FIG. 1. The gate electrode layer 149 can be formed using the same conductive film as the wiring layer 117. By application of different potentials to the gate electrode layer 148 and the gate electrode layer 149, the threshold voltage of the transistor 172 can be controlled, in a preferable manner, the negative shift in the threshold voltage can be suppressed. Alternatively, when the same potential is applied to the gate electrode layer 148 and the gate electrode layer 149, the on-state current of the transistor 172 can be increased.

Figure 5B:
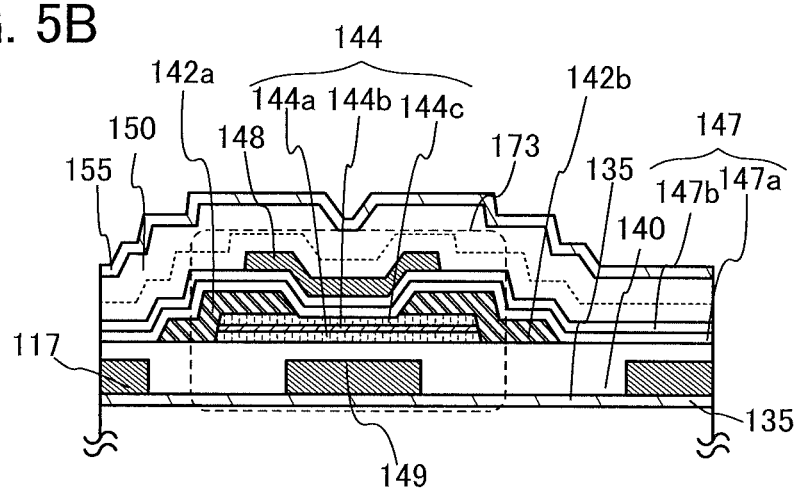
Figure 5C:
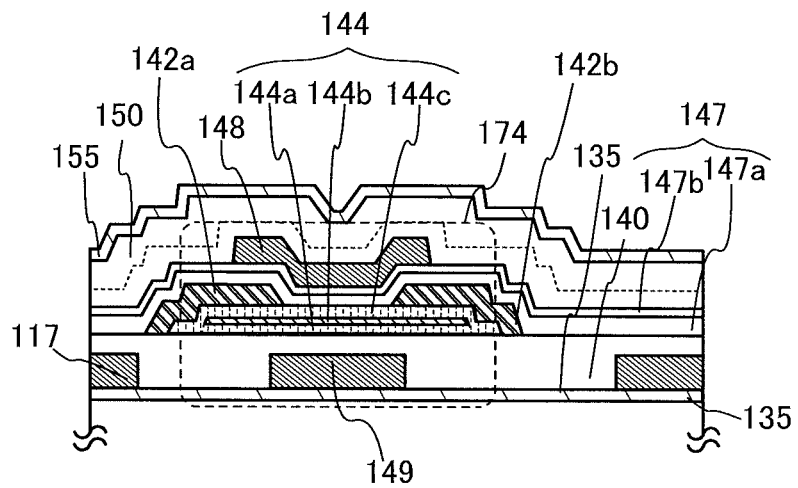

FIG. 5B similarly illustrates a transistor 173 having the structure in which the gate electrode layer 149 is added to the transistor 163. FIG. 5C illustrates a transistor 174 having the structure in which the gate electrode layer 149 is added to the transistor 164.

The semiconductor device of this embodiment can be combined with any of the semiconductor devices of the other embodiments as appropriate.

Embodiment 2

Figure 6A:
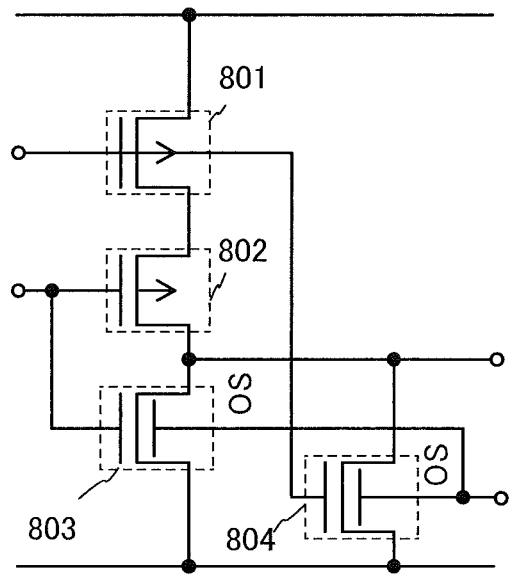
FIGS. 6A and 6B are circuit diagrams each illustrating a semiconductor device according to one embodiment of the present invention.
Figure 6B:
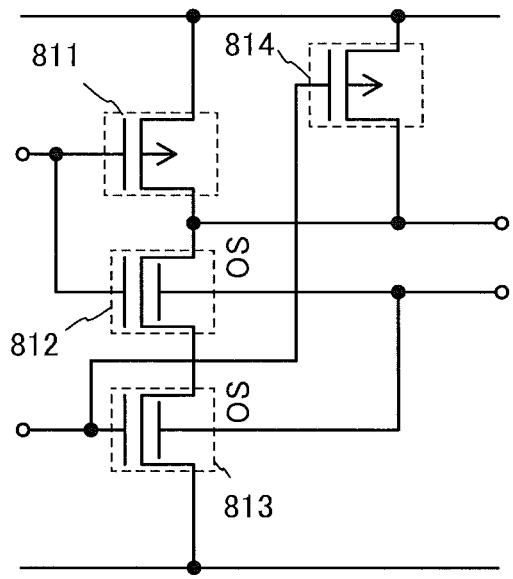

FIG. 6A illustrates an example of a circuit diagram of a NOR circuit, which is a logic circuit, as an example of the semiconductor device described in Embodiment 1. FIG. 6B is a circuit diagram of a NAND circuit.

In the NOR circuit illustrated in FIG. 6A, p-channel transistors 801 and 802 each have a structure similar to that of the transistor 160 in FIG. 1 in that a single crystal silicon substrate is used for the channel formation region, and n-channel transistors 803 and 804 each have a structure similar to structures of the transistor 162 illustrated in FIG. 1, the transistors 163 and 164 illustrated in FIGS. 4A and 4B, and the transistors 172 to 174 illustrated in FIGS. 5A to 5C in that an oxide semiconductor film is used for the channel formation region.

In the NOR circuit illustrated in FIG. 6A, a conductive layer controlling electrical characteristics of the transistor may be provided to overlap with a gate electrode layer with an oxide semiconductor film provided therebetween in each of the transistors 803 and 804. By controlling the potential of the conductive layer to GND, for example, the threshold voltages of the transistors 803 and 804 are increased, so that the transistors can be normally off.

In the NAND circuit illustrated in FIG. 6B, p-channel transistors 811 and 814 each have a structure similar to that of the transistor 160 in FIG. 1, and n-channel transistors 812 and 813 each have a structure similar to structures of the transistor 162 illustrated in FIG. 1, the transistors 163 and 164 illustrated in FIGS. 4A and 4B, and the transistors 172 to 174 illustrated in FIGS. 5A to 5C in that an oxide semiconductor film is used for the channel formation region.

In the NAND circuit illustrated in FIG. 6B, a conductive layer controlling electrical characteristics of the transistor may be provided to overlap with a gate electrode layer with an oxide semiconductor film provided therebetween in each of the transistors 812 and 813. By controlling the potential of the conductive layer to GND, for example, the threshold voltages of the transistors 812 and 813 are increased, so that the transistors can be normally off.

By using a transistor including an oxide semiconductor for the channel formation region and having extremely small off-state current for the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for manufacturing the semiconductor device can be provided.

By using the semiconductor device described in Embodiment 1, entry of impurity elements into the oxide semiconductor layer can be inhibited. In addition, by using the semiconductor device in which oxygen vacancies of the oxide semiconductor layer are reduced, a NOR circuit and a NAND circuit which are highly reliable and exhibit stable characteristics can be provided.

The NOR circuit and the NAND circuit including the transistor described in Embodiment 1 are described as examples in this embodiment; however, the present invention is not limited to the circuits, and an AND circuit, an OR circuit, or the like can be formed using the transistor described in Embodiment 1.

The semiconductor device of this embodiment can be combined with any of the semiconductor devices of the other embodiments as appropriate.

Embodiment 3

In this embodiment, an example of a semiconductor device (memory device) which includes the semiconductor device described in Embodiment 1, which can hold stored data even when not powered, and which has an unlimited number of write cycles is described with reference to drawings.

Figure 7A:
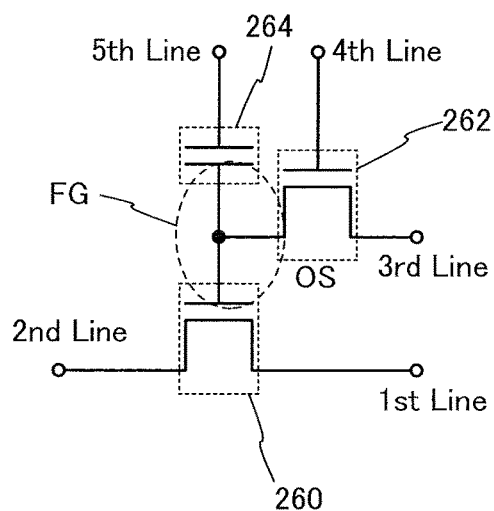
FIGS. 7A to 7C are circuit diagrams and a conceptual diagram of a semiconductor device according to one embodiment of the present invention.

FIG. 7A is a circuit diagram illustrating the semiconductor device of this embodiment.

A transistor 260 illustrated in FIG. 7A can have a structure similar to that of the transistor 160 illustrated in FIG. 1 and easily operates at high speed. Further, a transistor 262 can have a structure similar to structures of the transistor 162 illustrated in FIG. 1, the transistors 163 and 164 illustrated in FIGS. 4A and 4B, and the transistors 172 to 174 illustrated in FIGS. 5A to 5C and enables charge to be held for a long time owing to its characteristics.

Although all the transistors are n-channel transistors here, p-channel transistors can be used as the transistors used for the semiconductor device described in this embodiment.

In FIG. 7A, a first wiring (a 1st Line) is electrically connected to a source electrode layer of the transistor 260, and a second wiring (a 2nd Line) is electrically connected to a drain electrode layer of the transistor 260. A third wiring (3rd Line) is electrically connected to one of a source electrode layer and a drain electrode layer of the transistor 262, and a fourth wiring (4th Line) is electrically connected to a gate electrode layer of the transistor 262. A gate electrode layer of the transistor 260 and the other of the source electrode layer and the drain electrode layer of the transistor 262 are electrically connected to one electrode of a capacitor 264. A fifth wiring (5th Line) and the other electrode of the capacitor 264 are electrically connected to each other.

The semiconductor device illustrate in FIG. 7A utilizes a characteristic in which the potential of the gate electrode layer of the transistor 260 can be held, and thus enables data writing, holding, and reading as follows.

Writing and holding of data will be described. First, the potential of the fourth wiring is set to a potential at which the transistor 262 is turned on, so that the transistor 262 is turned on. Accordingly, the potential of the third wiring is supplied to the gate electrode layer of the transistor 260 and to the capacitor 264. That is, predetermined charge is supplied to the gate electrode layer of the transistor 260 (writing). Here, charge for supplying either of two different potential levels (hereinafter referred to as low-level charge and high-level charge) is given. After that, the potential of the fourth wiring is set to a potential at which the transistor 262 is turned off, so that the transistor 262 is turned off. Thus, the charge given to the gate electrode layer of the transistor 260 is held (holding).

Since the off-state current of the transistor 262 is extremely low, the charge of the gate electrode layer of the transistor 260 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode layer of the transistor 260. This is because in general, when the transistor 260 is an n-channel transistor, an apparent threshold voltage $V_{th\_H}$ in the case where the high-level charge is given to the gate electrode layer of the transistor 260 is lower than an apparent threshold voltage $V_{th\_L}$ in the case where the low-level charge is given to the gate electrode layer of the transistor 260. Here, an apparent threshold voltage refers to the potential of the fifth line, which is needed to turn on the transistor 260. Thus, the potential of the fifth wiring is set to a potential $V_0$ which is between $V_{th\_H}$ and $V_{th\_L}$, whereby charge given to the gate electrode layer of the transistor 260 can be determined. For example, in the case where the high-level charge is given in writing, when the potential of the fifth wiring is set to $V_0$ ($>V_{th\_H}$), the transistor 260 is turned on. In the case where the low-level charge is given in writing, even when the potential of the fifth wiring is set to $V_0$ ($<V_{th\_L}$), the transistor 260 remains in an off state. Therefore, the data held can be read by measuring the potential of the second wiring.

Note that in the case where memory cells are arrayed to be used, only data of desired memory cells needs to be read. In the case where such reading is not performed, a potential at which the transistor 260 is turned off regardless of the state of the gate electrode layer of the transistor 260, that is, a potential smaller than $V_{th\_H}$ may be given to the fifth wiring. Alternatively, a potential at which the transistor 260 is turned on regardless of the state of the gate electrode layer, that is, a potential higher than $V_{th\_L}$ may be given to the fifth wiring.

Figure 7B:
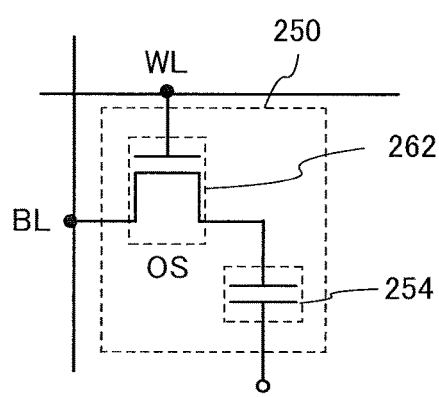
Figure 7C:
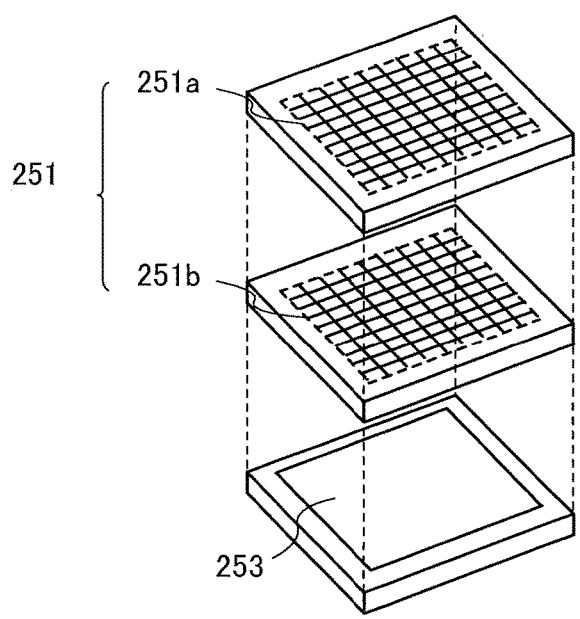

FIG. 7B illustrates another example of one embodiment of a structure of a memory device. FIG. 7B illustrates an example of a circuit configuration of a semiconductor device, and FIG. 7C is a conceptual diagram illustrating an example of a semiconductor device. First, the semiconductor device illustrated in FIG. 7B will be described, and then, the semiconductor device illustrated in FIG. 7C will be described.

In the semiconductor device illustrated in FIG. 7B, a bit line BL is electrically connected to one of the source electrode layer or the drain electrode layer of the transistor 262, a word line WL is electrically connected to the gate electrode layer of the transistor 262, and the other of the source electrode layer or the drain electrode layer of the transistor 262 is electrically connected to a first terminal of a capacitor 254.

Here, the transistor 262 including an oxide semiconductor has extremely low off-state current. For that reason, a potential of the first terminal of the capacitor 254 (or a charge accumulated in the capacitor 254) can be held for an extremely long time by turning off the transistor 262.

Next, writing and holding of data in the semiconductor device (a memory cell 250) illustrated in FIG. 7B will be described.

First, the potential of the word line WL is set to a potential at which the transistor 262 is turned on, and the transistor 262 is turned on. Accordingly, the potential of the bit line BL is supplied to the first terminal of the capacitor 254 (writing). After that, the potential of the word line WL is set to a potential at which the transistor 262 is turned off, so that the transistor 262 is turned off. Thus, the potential of the first terminal of the capacitor 254 is held (holding).

Because the off-state current of the transistor 262 is extremely small, the potential of the first terminal of the capacitor 254 (or a charge accumulated in the capacitor) can be held for an extremely long period.

Next, reading of data will be described. When the transistor 262 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is represented by $(C_B*V_{B0}+C*V)/(C_B+C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B*V_{B0}+C*V_1)/(C_B+C)$) is higher than the potential of the bit line BL in the case of holding the potential $V_0$ ($=(C_B*V_{B0}+C*V_0)/(C_B+C)$).

Then, by comparing the potential of the bit line BL with a predetermined potential, data can be read.

As described above, the semiconductor device illustrated in FIG. 7B can hold charge that is accumulated in the capacitor 254 for a long time because the amount of the off-state current of the transistor 262 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 7C will be described.

The semiconductor device illustrated in FIG. 7C includes memory cell arrays 251a and 251b including a plurality of memory cells 250 illustrated in FIG. 7B as memory circuits in an upper portion, and a peripheral circuit 253 in a lower portion which is necessary for operating a memory cell array 251 (the memory cell arrays 251a and 251b). Note that the peripheral circuit 253 is electrically connected to the memory cell array 251.

In the structure illustrated in FIG. 7C, the peripheral circuit 253 can be provided directly under the memory cell array 251 (the memory cell arrays 251a and 251b). Thus, the size of the semiconductor device can be reduced.

It is preferable that a semiconductor material of the transistor provided in the peripheral circuit 253 be different from that of the transistor 262. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which need to operate at high speed can be favorably realized by the transistor.

Note that FIG. 7C illustrates, as an example, the semiconductor device in which two memory cell arrays 251 (the memory cell arrays 251a and 251b) are stacked; however, the number of memory cell arrays to be stacked is not limited thereto. Three or more memory cell arrays may be stacked.

When a transistor including an oxide semiconductor in the channel formation region is used as the transistor 262, stored data can be held for a long time. In other words, power consumption can be sufficiently reduced because a semiconductor memory device in which refresh operation is unnecessary or the frequency of refresh operation is extremely low can be provided.

Further, the semiconductor device described in this embodiment is the semiconductor device described in Embodiment 1 in which the oxide semiconductor layers are stacked to form the oxide semiconductor stack and the second oxide semiconductor layer to be the channel formation region is apart from the surface of the oxide semiconductor stack. Thus, a highly reliable semiconductor device that exhibits stable electrical characteristics can be obtained.

Embodiment 4

In this embodiment, examples of application of the semiconductor device described in any of the above embodiments to electronic devices such as a mobile phone, a smartphone, or an electronic book will be described with reference to FIG. 8, FIG. 9, FIG. 10, and FIGS. 11A and 11B.

Figure 8:
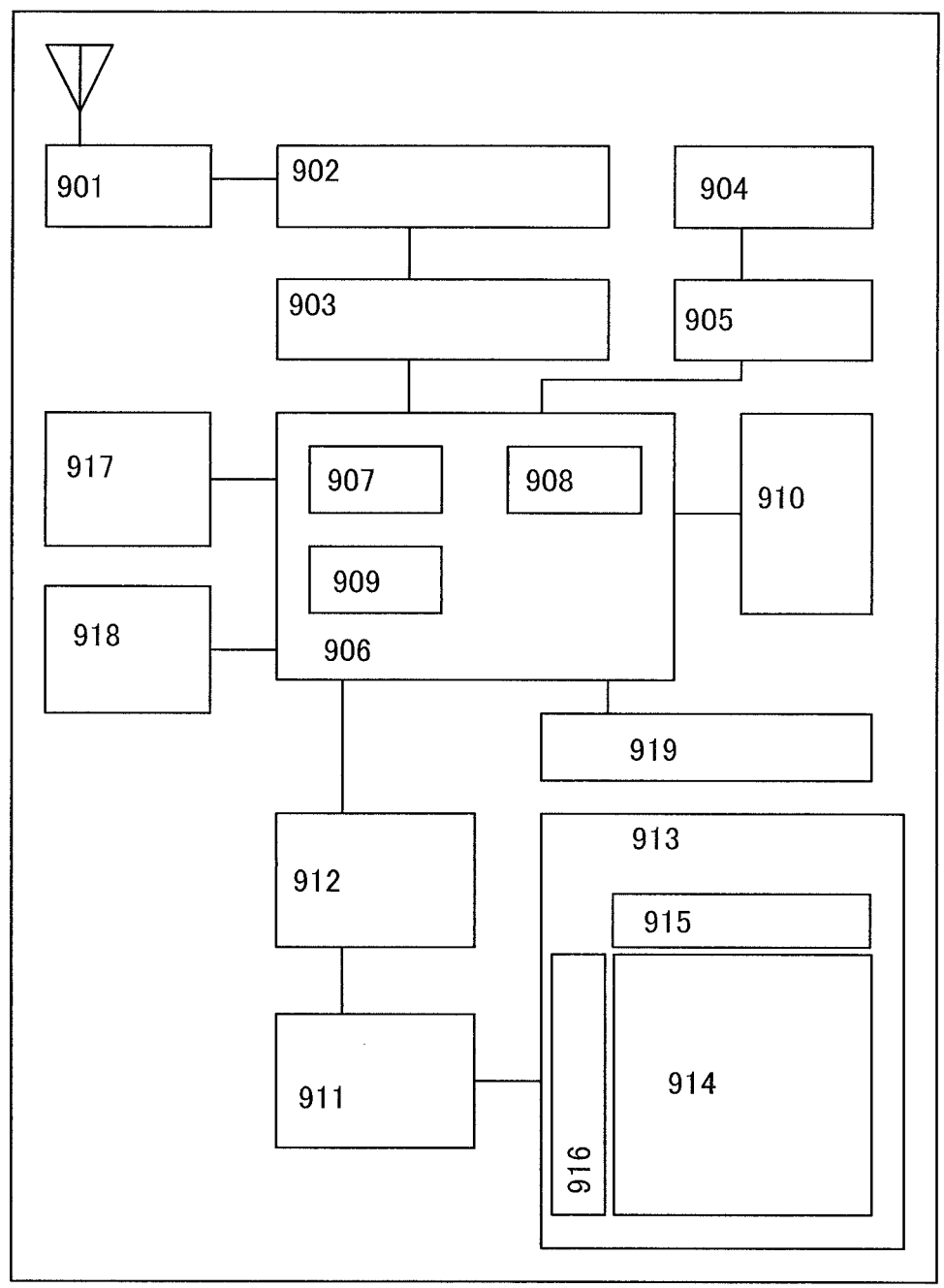
FIG. 8 is a block diagram of a semiconductor device according to one embodiment of the present invention.

FIG. 8 is a block diagram of an electronic device. An electronic device illustrated in FIG. 8 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced.

Figure 9:
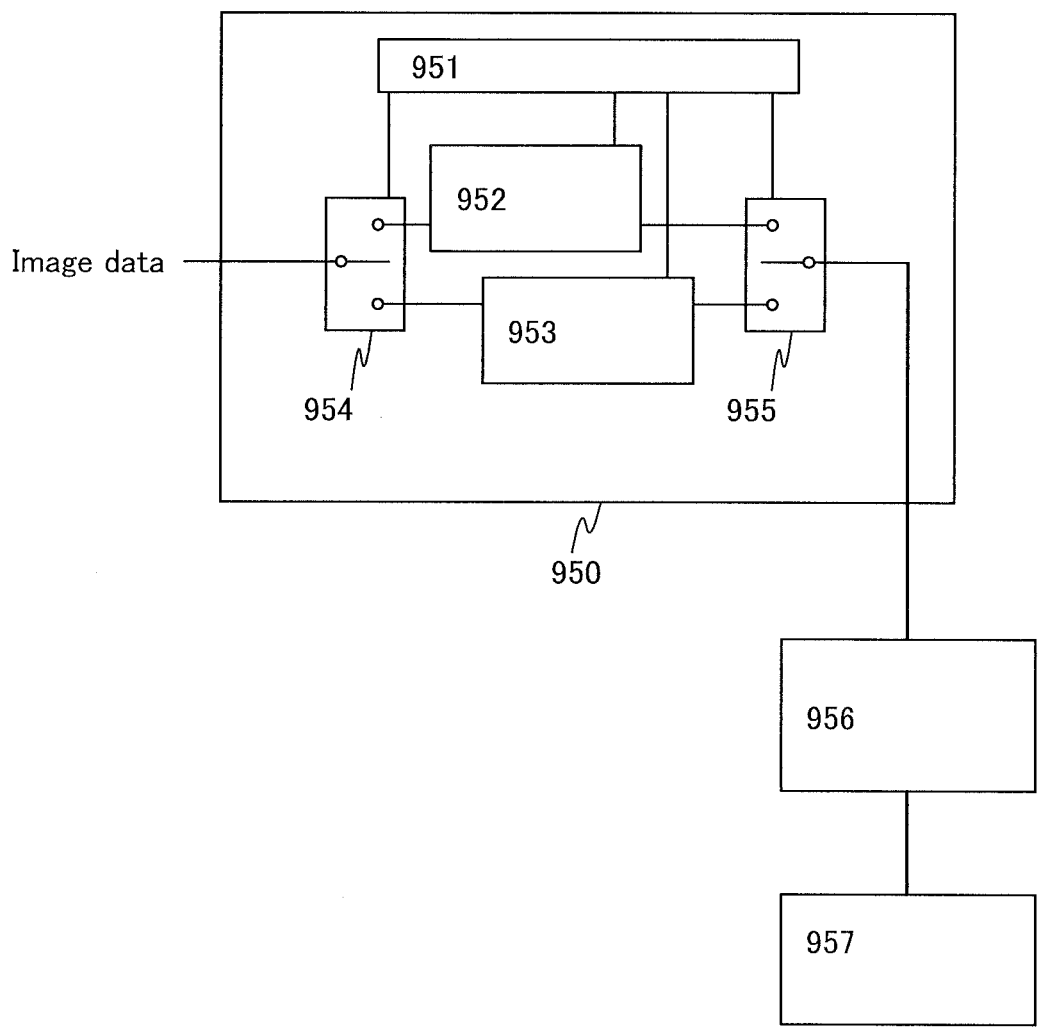
FIG. 9 is a block diagram of a semiconductor device according to one embodiment of the present invention.

FIG. 9 illustrates an example in which any of the semiconductor devices described in the above embodiments is used for a memory circuit 950 in a display. The memory circuit 950 illustrated in FIG. 9 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 though the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not necessarily separate memories and a single memory may be divided and used. By employing any of the semiconductor devices described in the above embodiments for the memory 952 and the memory 953, data can be written and read at high speed and held for a long time, and power consumption can be sufficiently reduced. Further, a semiconductor device which is hardly affected by entry of water, moisture, and the like from the outside and has high reliability can be provided.

Figure 10:
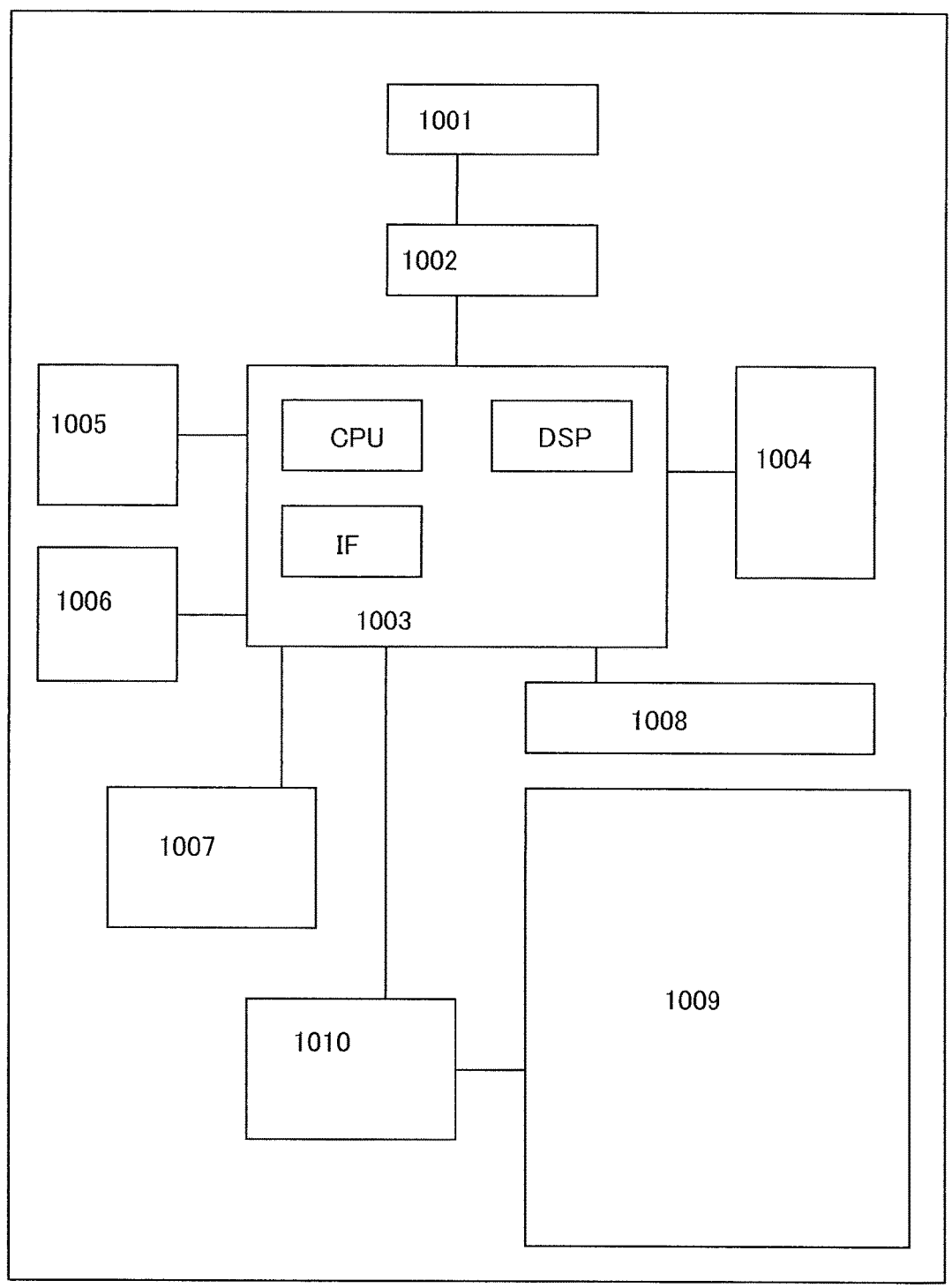
FIG. 10 is a block diagram of a semiconductor device according to one embodiment of the present invention.

FIG. 10 is a block diagram of an electronic book. The electronic book in FIG. 10 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 10. The memory circuit 1007 has a function of temporarily storing the contents of a book. For example, when a user uses a highlight function, the memory circuit 1007 stores and holds data of a portion specified by the user. Note that the highlight function is used to make a difference between a specific portion and the other portions while reading an electronic book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Also in such a case, by employing the semiconductor devices described in any of the above embodiments, data can be written and read at high speed and held for a long time, and power consumption can be sufficiently reduced. Further, a semiconductor device which is hardly affected by entry of water, moisture, and the like from the outside and which has high reliability can be provided.

Figure 11A:
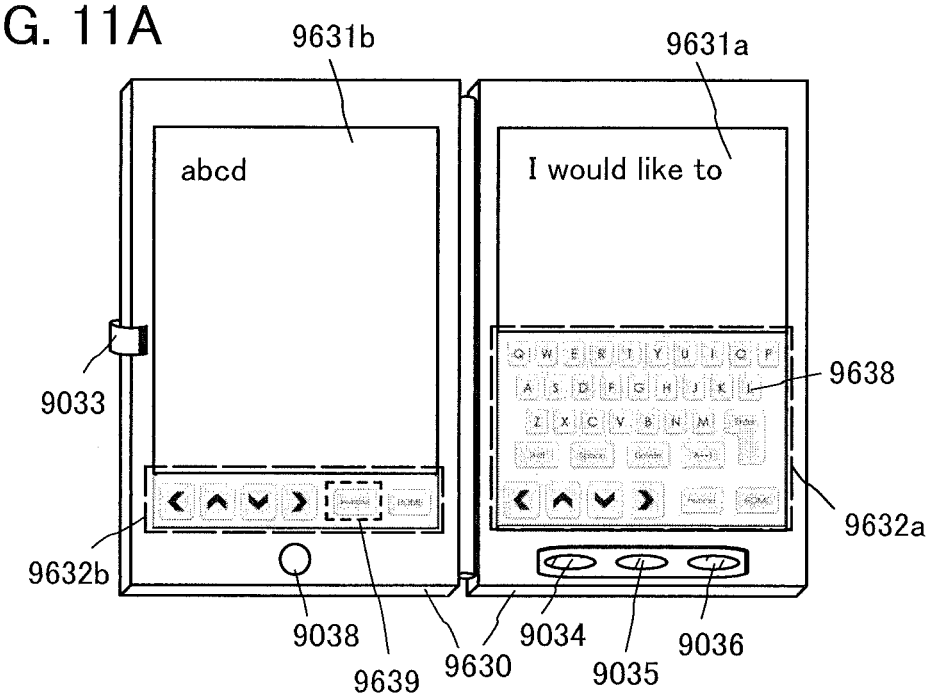
FIGS. 11A and 11B illustrate an electronic device in which a semiconductor device according to one embodiment of the present invention can be used.
Figure 11B:
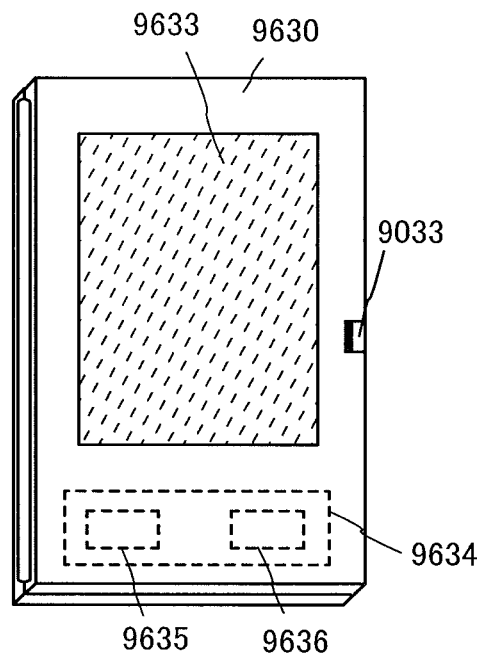

FIGS. 11A and 11B illustrate a specific example of an electronic device. FIGS. 11A and 11B illustrate a foldable tablet terminal. The tablet terminal is opened in FIG. 11A. The tablet terminal includes a housing 9630, a display portion 9631a, a display portion 9631b, a display mode switch 9034, a power switch 9035, a power saver switch 9036, a clasp 9033, and an operation switch 9038.

The semiconductor device described in Embodiment 1 can be used for the display portion 9631a and the display portion 9631b, so that the tablet terminal can have high reliability. In addition, the memory device described in the above embodiment may be applied to the semiconductor device of this embodiment.

Part of the display portion 9631a can be a touch panel region 9632a and data can be input when a displayed operation key 9638 is touched. Although a structure in which a half region in the display portion 9631a has only a display function and the other half region also has a touch panel function is shown as an example, the display portion 9631a is not limited to the structure. For example, the display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Although the display portion 9631a and the display portion 9631b have the same display area in FIG. 11A, one embodiment of the present invention is not limited to this structure. The display portion 9631a and the display portion 9631b may have different areas or different display quality. For example, one of them may be a display panel that can display higher-definition images than the other.

The tablet terminal is closed in FIG. 11B. The tablet terminal includes the housing 9630, a solar cell 9633, a charge and discharge control circuit 9634, a battery 9635, and a DCDC converter 9636. In FIG. 11B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 11A and 11B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The structures, methods, and the like described in this embodiment can be combined as appropriate with any of the structures, methods, and the like described in the other embodiments.

This application is based on Japanese Patent Application serial no. 2012-178641 filed with Japan Patent Office on Aug. 10, 2012, the entire contents of which are hereby incorporated by reference.

What is claimed is:
1. A method for fabricating a semiconductor device, comprising the steps of:
  over a first oxide insulating layer, forming a first oxide semiconductor layer and a second oxide semiconductor layer;
  performing on the second oxide semiconductor first heat treatment in an atmosphere of oxygen and nitrogen;
  forming a third oxide semiconductor layer over the second oxide semiconductor layer;
  forming a second oxide insulating layer over the third oxide semiconductor layer; and
  forming a third oxide insulating layer over the second oxide insulating layer;
  performing second heat treatment on the second oxide insulating layer and the third oxide insulating layer in an atmosphere of oxygen and nitrogen,
  wherein the second oxide semiconductor layer has a higher crystallinity than the first oxide semiconductor layer and the third oxide semiconductor layer, wherein the third oxide semiconductor layer is in contact with a top surface of the second oxide semiconductor layer and a side surface in an end portion of the second oxide semiconductor layer, and wherein the first oxide semiconductor layer and the third oxide semiconductor layer are in physical contact with each other.

2. The method for fabricating a semiconductor device according to claim 1, further comprising the steps of:

forming a first electrode and a second electrode over the third oxide semiconductor layer;

forming a gate electrode over the second oxide insulating layer and the third oxide insulating layer, and wherein the second oxide insulating layer and the third oxide insulating layer are over the first electrode, the second electrode, and the third oxide semiconductor layer.

3. The method for fabricating a semiconductor device according to claim 1, further comprising the step of:

planarizing the first oxide insulating layer before forming the first oxide semiconductor layer.

4. The method for fabricating a semiconductor device according to claim 1, wherein the first oxide insulating layer includes aluminum oxide.

5. The method for fabricating a semiconductor device according to claim 1, wherein the first oxide semiconductor layer is amorphous, wherein the second oxide semiconductor layer has a crystalline structure, and wherein the third oxide semiconductor layer is amorphous.

6. A method for fabricating a semiconductor device, comprising the steps of:

forming a first oxide semiconductor layer and a second oxide semiconductor layer;

etching the first oxide semiconductor layer and the second oxide semiconductor layer so that an island shape oxide semiconductor stack is formed;

forming a third oxide semiconductor layer covering and in contact with a top surface of the island shape oxide semiconductor stack and a side surface in an end portion of the island shape oxide semiconductor stack;

forming a first electrode and a second electrode over the third oxide semiconductor layer;

forming a first oxide insulating layer over the third oxide semiconductor layer, forming a second oxide insulating layer over the first oxide insulating layer; and forming a gate electrode over the first oxide insulating layer and the second oxide insulating layer, wherein the first oxide insulating layer and the second oxide insulating layer are over the first electrode, the second electrode, and the third oxide semiconductor layer; and wherein the first oxide semiconductor layer and the third oxide semiconductor layer are in physical contact with each other.

7. The method for fabricating a semiconductor device according to claim 6, wherein the first oxide semiconductor layer is amorphous.

8. The method for fabricating a semiconductor device according to claim 6, wherein the second oxide semiconductor layer has a crystalline structure.

9. The method for fabricating a semiconductor device according to claim 6, further comprising the step of:

performing a first heat treatment after forming the second oxide semiconductor layer.

10. The method for fabricating a semiconductor device according to claim 9, wherein the first heat treatment is performed in an inert gas atmosphere.

11. The method for fabricating a semiconductor device according to claim 6, further comprising the step of:

performing a second heat treatment after forming the third oxide semiconductor layer.

12. The method for fabricating a semiconductor device according to claim 11, wherein the second heat treatment is performed in an inert gas atmosphere.

13. A method for fabricating a semiconductor device, comprising the steps of:

forming a first oxide semiconductor layer and a second oxide semiconductor layer;

etching the first oxide semiconductor layer and the second oxide semiconductor layer;

forming a third oxide semiconductor layer covering and in contact with a top surface of the second oxide semiconductor layer and a side surface in an end portion of the second oxide semiconductor layer;

forming a first electrode and a second electrode over the third oxide semiconductor layer;

forming a first oxide insulating layer over the third oxide semiconductor layer, forming a second oxide insulating layer over the first oxide insulating layer; and forming a gate electrode over the first oxide insulating layer and the second oxide insulating layer, and wherein the first oxide insulating layer and the second oxide insulating layer are over the first electrode, the second electrode, and the third oxide semiconductor layer; and wherein the first oxide semiconductor layer and the third oxide semiconductor layer are in physical contact with each other.

14. The method for fabricating a semiconductor device according to claim 13, wherein the first oxide semiconductor layer is amorphous.

15. The method for fabricating a semiconductor device according to claim 13, wherein the second oxide semiconductor layer has a crystalline structure.

16. The method for fabricating a semiconductor device according to claim 15, further comprising the step of:

performing a first heat treatment after forming the second oxide semiconductor layer.

17. The method for fabricating a semiconductor device according to claim 16, wherein the first heat treatment is performed in an inert gas atmosphere.

18. The method for fabricating a semiconductor device according to claim 13, further comprising the step of:

performing a second heat treatment after forming the third oxide semiconductor layer.

19. The method for fabricating a semiconductor device according to claim 18, wherein the second heat treatment is performed in an inert gas atmosphere.

* * * * *